(12) United States Patent
Sexton et al.

(10) Patent No.: US 7,003,055 B2
(45) Date of Patent: Feb. 21, 2006

(54) SYSTOLIC EQUALIZER AND METHOD OF USING SAME

(75) Inventors: Thomas A. Sexton, Forth Worth, TX (US); Jari Parviainen, Jaali (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/486,621

(22) PCT Filed: Oct. 25, 2002

(86) PCT No.: PCT/US02/34284

§ 371 (c)(1),
(2), (4) Date: Jul. 6, 2004

(87) PCT Pub. No.: WO03/036299

PCT Pub. Date: May 1, 2003

(65) Prior Publication Data

US 2004/0240591 A1    Dec. 2, 2004

Related U.S. Application Data

(60) Provisional application No. 60/349,306, filed on Oct. 26, 2001.

(51) Int. Cl.
*H04L 27/06*   (2006.01)
(52) U.S. Cl. .................................... 375/341; 375/229
(58) Field of Classification Search .............. 375/229, 375/230, 232, 233, 262, 265, 316, 340, 341; 714/786, 794, 795, 796
See application file for complete search history.

(56) References Cited

U.S. PATENT DOCUMENTS 5,042,036 A * 8/1991 Fettweis ..................... 714/795

2002/0181621 A1   12/2002 Bohnhoff et al. ........... 375/340
2003/0053535 A1 *  3/2003 Malkov et al. ............. 375/233

OTHER PUBLICATIONS

Lloyd, A.H., Reynolds, M.R., & Shah, Y.C.; "VLSI Architectures for Viterbi Decoding"; PA Consulting Group, Chapter 6, pp. 1-7.
Chakraborty, M., Pervin, S.; "A Systolic Array Realization of the Adaptive Decision Feedback Equalizer"; Signal Processing, pp. 2633-2640, (2000).
Fettweis, G., & Meyr, H.; "High-Rate Viterbi Processor: A Systolic Array Solution"; IEEE Journal, vol. 8, No. 8, pp. 1520-1534, Oct. 1990.

(Continued)

*Primary Examiner*—Chieh M. Fan
(74) *Attorney, Agent, or Firm*—Harrington & Smith, LLP

(57) ABSTRACT

A method and apparatus provide a systolic equalizer for Viterbi equalization of an 8-PSK signal distorted by passage through a communication channel. The systolic equalizer architecture is scalable to process, as examples, four, eight and 16 state received signals. An equalizer in accordance with this invention includes a logical arrangement of a plurality of instantiations of locally coupled processing elements forming a systolic array for processing in common received signal samples having distortion induced by passage through a communication channel. The equalizer outputs soft values for input to a decoder, the soft values representing an approximation of maximum a posteriori (MAP) probabilities. A trellis search procedure is employed to reconstruct estimates of a received signal sequence based on a reduced number of states. The reduced number of states is represented by a plurality of groups determined by partitioning a symbol constellation such that there are fewer groups than possible symbols.

26 Claims, 17 Drawing Sheets

OTHER PUBLICATIONS

Hemkumar, N., Kota, K., & Cavallaro, J.; "Cape-VLSI Implementation of a Systolic Processor Array: Architecture, Design & Testing"; IEE Journal, Dept. of Electrical & Computer Engineering; pp. 64-69, (1991).

Koch, W. & Baier, A.; "Optimum and Sub-Optimum Detection of Coded Data Disturbed by Time-Varying Intersymbol Interference"; Philips Kommunikations Industrie AG, Germany; IEEE; pp. 1679-1684; (1990).

Gulak, P.G. & Kailath, T.; "Locally Connected VLSI Architectures for the Viterbi Algorithm"; IEEE Journal; vol. 6, No. 3, pp. 527-537, Apr. 1988.

Eyuboglu, M.V. & Qureshi, S.U.H.; "Reduced-State Sequence Estimation with Set Partitioning and Decision Feedback"; IEEE Journal; vol. 36, No. 1, pp. 13-20, Jan. 1988.

* cited by examiner

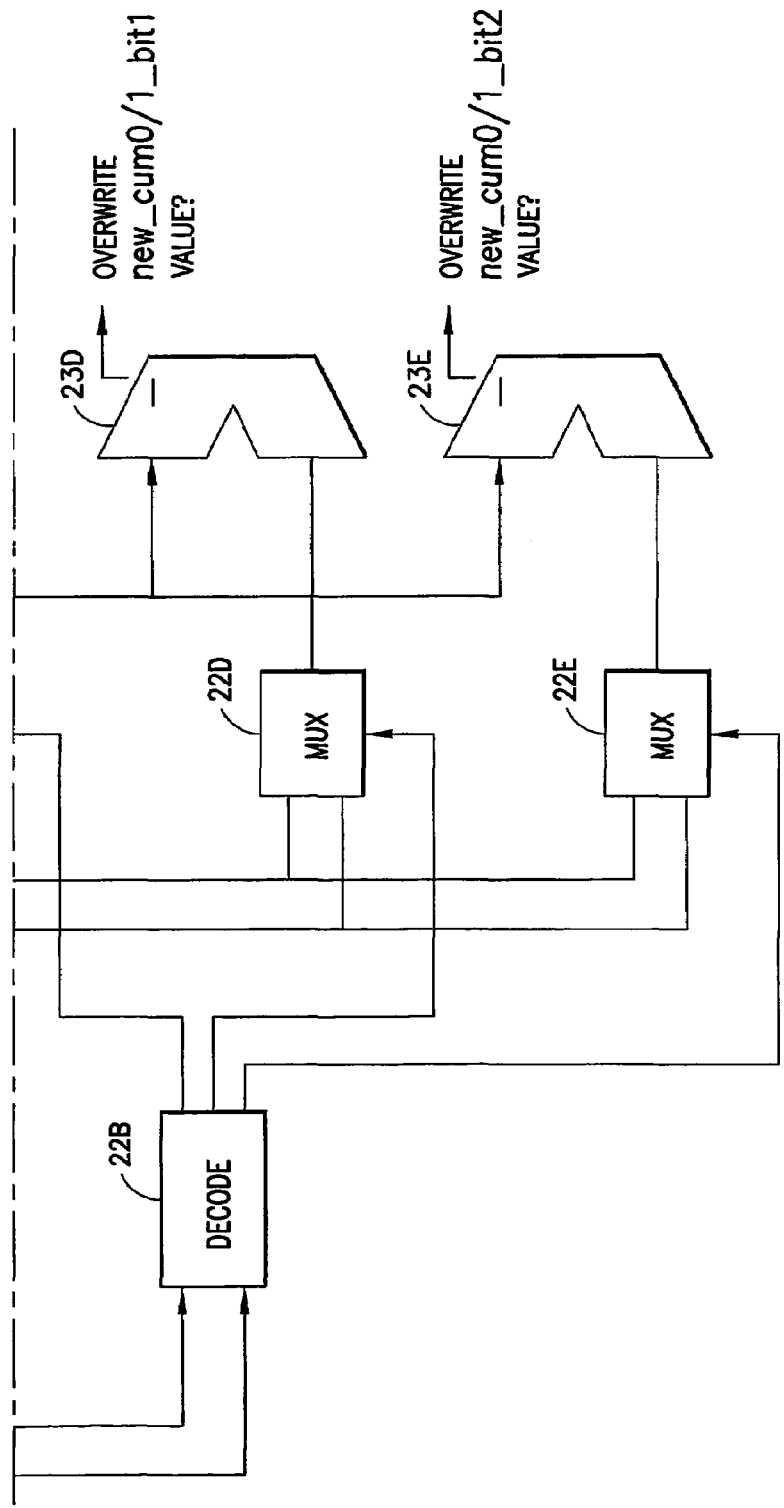

EQUALIZER EQUATIONS

BRANCH: $b_{i,j,k} = -\left\| y - \left( h_0 x_k + \sum_{m=1}^{m=N_c} h_{k-m} H_{i,m-1} \right) \right\|^2$ CUM: $c_{j,t+1} = \max_{i,k} c_{i,t} + b_{i,j,k}$ WINNING TRANSITION: $\hat{k}_j = \arg_k \max_{i,k} c_{i,t} + b_{i,j,k}$ WINNING ORIGINATION STATE: $\hat{i}_j = \arg_i \max_{i,k} c_{i,t} + b_{i,j,k}$ HISTORY UPDATE: $H_j = H_{\hat{i}j} \cup x_{\hat{k}j}$ SOFT VALUE CALCULATION: $\text{soft}_{k,t} = \max_{m \in S_{1,k}} c_{j,t,m} - \max_{m \in S_{0,k}} c_{j,t,m}$

FIG.11B

SYSTOLIC EQUALIZER AND METHOD OF USING SAME

CLAIM OF PRIORITY FROM COPENDING PATENT APPLICATION

This patent application claims priority under 35 U.S.C. §119(e) from Provisional Patent Application No. 60/349,306, filed Oct. 26, 2001, and PCT/US02/34284, filed Oct. 25, 2002 reference herein in its entirety.

FIELD OF THE INVENTION

This invention relates generally to electronic circuits known as equalizers. More particularly, this invention relates to a Very Large Scale Integration (VLSI) architecture for implementation of the equalizer for communication systems, where the equalizer comprises a plurality of like processing elements (PEs) that are coupled together in a systolic-type of architecture.

BACKGROUND OF THE INVENTION

A communications system equalizer is a circuit used in a receiver to compensate a received signal for losses and distortion experienced in a communication path between a transmitter of the signal and the receiver. In RF communication systems, such as cellular telephone systems, conventional practice could construct the equalizer circuit using discrete components or, more recently, using a suitably programmed digital signal processor (DSP). In this approach the DSP is normally not dedicated to performing only the equalizer function, but more typically is responsible for the execution of a number of other signal processing tasks as well. As a result, as data rates continue to increase it has been found that the DSP capacity, and especially the lack of available DSP capacity, has created a problem. The increase in data rates also increases the equalizer algorithm complexity, and thus requires higher DSP processing performance. Simply using a faster and higher powered DSP also creates problems, as this approach requires a significant number of skilled engineers, and a large amount of time, resources and risk, to migrate the existing DSP-executed software applications to a new DSP platform. In addition, faster DSPs generally consume more current, which can be a significant disadvantage in battery powered devices such as cellular telephones and personal communicators. This situation has created a need to transfer the DSP equalizer software functionality to hardware.

An Application Specific Integrated Circuit (ASIC) hardware implementation provides more processing power and is more area efficient than a DSP solution. Thus, there is a need for an equalizer implemented in hardware that is power and area efficient. There is also a need for a scalable equalizer. However, ASIC technology does not provide a quick design implementation, and is limited in its ability to be changed to accommodate revisions to a design or specification.

Trellis searching architectures have been studied for GSM (Global System for Mobile Communications) systems using serial (centralized) and parallel (distributed) approaches, as evidenced by A. Lloyd, M. Reynolds and Y. Shah, "VLSI Architectures for Viterbi Decoding," IEE Colloquium on VLSI Implementations for Second Generation Digital Cordless and Mobile Telecommunication Systems, 1990, pp. 6/1–6/7, hereafter referred to as Lloyd and incorporated by reference herein in its entirety. The scalability of a systolic approach, as discussed by P. Gulak and T. Kailath, "Locally Connected VLSI Architectures for the Viterbi Algorithm," IEEE Journal on Selected Areas in Communications, Vol. 6, No. 3, April 1988, pp. 527–537, hereafter referred to as Gulak and incorporated by reference herein in its entirety, has lead to a single type of processing element (PE) which can be used as the basis for either a serial or parallel approach to Viterbi decoding. The PE is amenable to the pipelining of computational elements, see P. Pirsch, "Architectures for Digital Signal Processing," John Wiley, New York, 1996, hereafter referred to as Pirsch and incorporated by reference herein in its entirety, which allows multiple operations to occur on each clock edge.

In Lloyd a locally connected array is shown (FIG. 3), and these authors state that their VLSI architecture is applicable to both Viterbi decoding and Viterbi equalization.

Also of interest is publication by Chakraborty, Mrityunjoy and Suraiya Pervin, "A systolic array realization of the adaptive decision feedback equalizer", Signal Processing, Vol. 80 (2000), No.: 12, pp. 2633–2640.

A need exists, as yet unfulfilled prior to this invention, to provide a scalable channel equalizer that is constructed and operated as a parallel, systolic array of like processing elements that exhibits, among other features, reduced state sequence estimation, decision feedback and a global search function for metric normalization and soft value determination in a serial parallel processor structure.

SUMMARY OF THE INVENTION

An embodiment of this invention provides a method that equalizes a phase modulated signal, e.g., an 8-PSK (Phase Shift Keying) signal, that is distorted by multipath during passage through a communication channel. Another embodiment of this invention provides apparatus, embodied as circuitry, that equalizes a phase modulated signal, e.g., an 8-PSK signal, that is distorted by passage through a communication channel. The preferred embodiment provides a systolic equalizer for realizing the Viterbi equalization of an 8-PSK signal.

A presently preferred embodiment of the systolic equalizer of this invention employs one Processing Element (PE) for each state of N states of the equalizer function. In the preferred embodiment each PE has a local memory (LM) and an associated Record (R). In the presently preferred embodiment the equalizer processes one burst of samples of a received signal at a time, and a channel estimator provides to the equalizer an estimate of the channel, convolved with a pre-filter response. The equalizer constructs a look up table (LUT) of the product of individual channel taps with individual constellation points of the 8-PSK constellation. An initialization function initializes the N Records and the N local memories, and a first sample is input to all of the PE's in parallel. Each PE then processes a Record and passes the processed Record to a neighboring PE. This occurs N times per sample so that each Record visits every PE. The Records and Local Memories are modified as required by each PE. After all PEs have processed all of the Records, a soft output calculation unit obtains data from a terminal (e.g., a rightmost) PE of the array of PEs and produces soft output for a previous symbol. The process can then be repeated for the next sample until the entire burst of samples is processed. Other embodiments of a systolic array equalizer are also provided.

An equalizer in accordance with this invention includes a logical arrangement of a plurality of instantiations of locally coupled processing elements that form a systolic array for processing in common received signal samples having distortion induced by passage through a communications channel. The equalizer outputs soft values for input to a decoder, the soft values representing an approximation of maximum a posteriori (MAP) probabilities. A trellis search procedure is employed to reconstruct estimates of a received signal sequence based on a reduced number of states. The reduced number of states is represented by a plurality of groups determined by partitioning a symbol constellation such that there are fewer groups than possible symbols.

BRIEF DESCRIPTION OF THE DRAWINGS

The foregoing and other features, aspects, and advantages of embodiments of this invention are made more apparent in the following description of presently preferred embodiments of the invention, when read in conjunction with the accompanying drawings. It is to be understood, however, that the drawings are provided solely for the purposes of illustration, and are not to be viewed as a definition of the limits of the invention.

FIG. 3A is a block diagram illustrative of PE structure in accordance with an embodiment of the invention, while

FIG. 9A shows an example of a trellis for a 16-state equalizer, that is not fully connected although is nicely grouped, while

FIGS. 11A, 11B, 11C and 11D, collectively referred to as FIG. 11, are useful in explaining the operation of the equalizer algorithm, where FIG. 11A shows the overall algorithm flow and a definition of the notation, FIG. 11B shows a set of presently preferred equalizer equations, FIG. 11C shows a four state trellis and the maximization of the cumulative metric, and FIG. 11D shows the update procedure for the PE Local Memory and Channel LUT.

DETAILED DESCRIPTION OF THE PREFERRED EMBODIMENTS

As employed herein a systolic processor is one that "pumps" or transfers data from one processing element to another. Systolic processor arrays, per se, are well known in the art. Systolic processor arrays have been used to increase pipelined computing capability, and therefore the computing speed, of various types of signal processors. Systolic processor arrays have been used for matrix multiplication, as well as for handwriting recognition and image processing tasks, among others. The systolic array may have the form of a two-dimensional linear array, or a three-dimensional area array.

An embodiment of the present invention defines a method and an apparatus that provide for the detection of an 8-PSK signal distorted by passage through a communication channel. A preferred, but not limiting, embodiment provides a systolic equalizer for Viterbi equalization of an 8-PSK signal for EDGE (Enhanced Data rate for Global Evolution) RF communication devices (an evolution of the GSM time division, multiple access (TDMA) mobile communications system). In the EDGE system the channel coder is convolutional, and uses multiple data rates and puncturing patterns. RMS delay spreads on the order of a symbol period are common, and equalization is required to meet the minimum performance requirements of the EDGE standard. Some applicable equalization algorithms are discussed by W. Gerstacker and R. Schober, "Equalization for EDGE mobile communications", IEE Electronics Letters, Jan. 2, 2000, Vol. 36, No. 2, pp. 189–191, incorporated by reference herein in its entirety.

Figure 10:
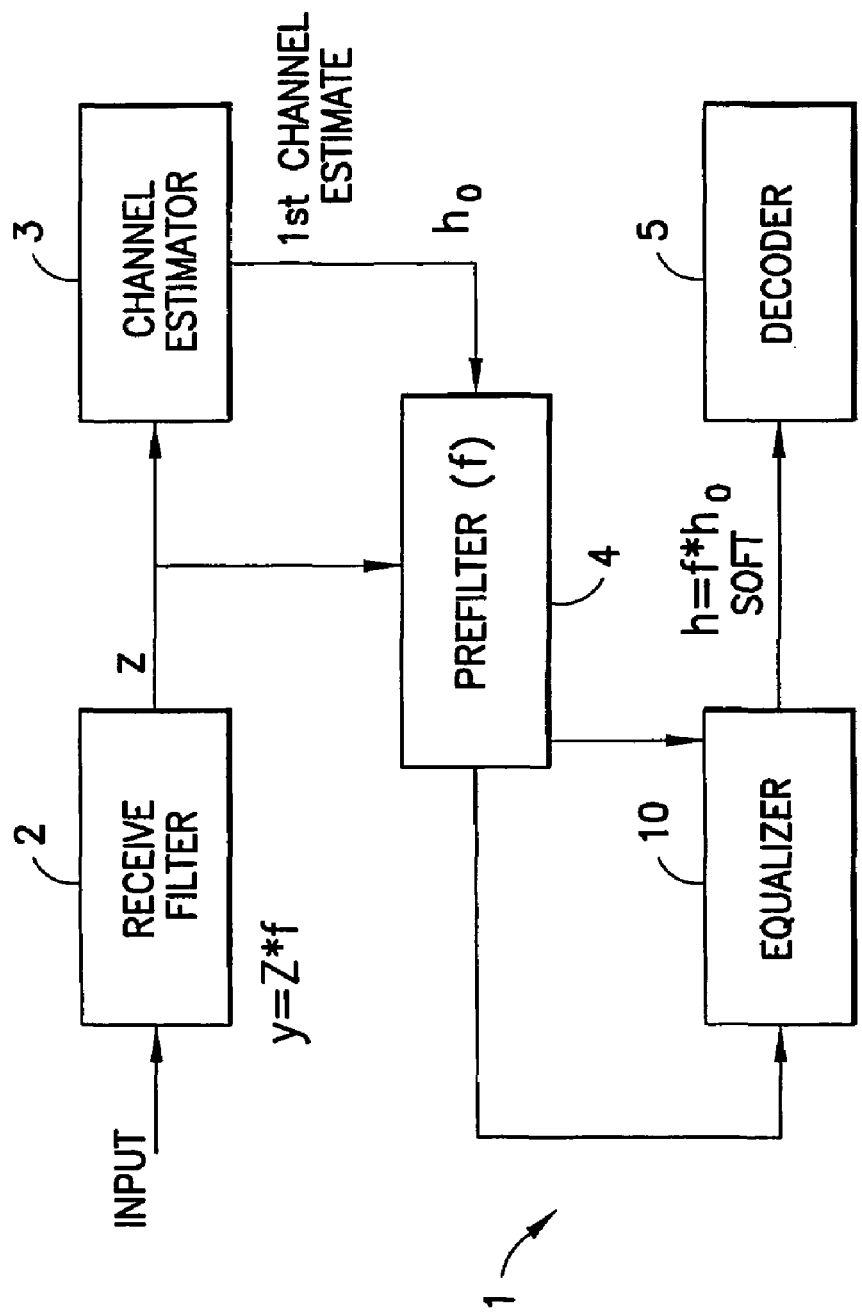
FIG. 10 illustrates a receiver that includes an equalizer that is constructed and operated in accordance with this invention.

Referring first to FIG. 10, there is illustrated a simplified block diagram of a receiver 1, which in the preferred but not limiting embodiment is an EDGE receiver, that includes an equalizer 10 that is constructed and operated in accordance with this invention. An input RF signal is first converted to a digital signal by analog-to-digital conversion (ADC) to form the input signal to a receiver filter 2. The filtered signal z is then applied to a channel estimator 3, as well as to a prefilter 4. The channel estimator 3 forms an estimate of the RF communications channel $h_0$ using a midamble training sequence of the EDGE burst, and a prefilter function (f) is calculated. The prefiltered signal samples y, where y equals z convolved with f, are passed to the equalizer 10 along with the impulse response (overall channel estimate) h, where h equals $h_0$ convolved with f. The signal y is equalized in equalizer block 10, and the resulting soft values, soft, are input to a channel decoder 5, such as a Viterbi decoder.

The theory of operation of the equalizer 10 of this invention is summarized as follows.

Reconfigurable hardware maybe used to create the equalizer 10 in accordance with the present invention. Locally connected processing elements (PE)s enable small circuit area realizations, and the preferred systolic architecture of the equalizer 10 is applicable for searching a trellis using the Viterbi algorithm. Realizations of 2, 4 and 16 state reduced state soft output equalizers have been evaluated by the inventors. Evaluations of the central processing tasks show that these tasks may be implemented with, by example, 30–200 kgates (thousand gates) operated at 25–35 MHz, depending on the number of states in the equalizer.

The following discussion explains the algorithm which the systolic equalizer architecture implements. It is not intended to be read as a derivation of the algorithm.

The formulation given in Lloyd for the Viterbi algorithm is repeated here.

```
For each sample received (y) at time (τ)
    For each state (k)
        For each state (j) that can lead to this state
            j' = argmin_j(C_j+D_{j,k}(y))
            C_k = C_{j'} + D_{j',k}(y)
            For all τ' < τ
                P_{k,τ'} = P_{j',τ'}
            P_{k,τ} = T_{j',k}
```

The variables used here are defined as follows: C is the cumulative metric; D is the branch metric; and P is the symbol history. For the equalizer problem $D=\|y-r\|^2$, where y is the received sample and r is a reference sample calculated based on path history and the transition to the current state being evaluated.

A basic function of the Viterbi algorithm is to determine what sequence of symbols has been received. One additional determination that is needed for equalization and decoding, such as turbo decoding, is to associate a probability value with each received element in the sequence. This is referred to in the art as soft output, which is an approximation of the maximum a posterior (MAP) probability of the bit in question (see H. Van Trees, "Detection, Estimation, and Modulation Theory," John Wiley, New York, 1968 for a discussion of exact MAP probabilities, and see Koch and Baier for approximate MAP probabilities.)

A most straightforward way to determine the received sequence is to test for correlation of the received data with all possible received sequences. However, for a GSM 8-PSK EDGE burst of duration 148 symbols, there are too many possible sequences to test for in a typical real-time communications application. However, since the sequences all contain identical sub-sequences, the searching task can be reduced significantly by taking an initial sub-sequence and extending it by one sample. The resulting sequences are then extended by one sample. For each extension, a distance measure (C, above) is updated to show how close the candidate sequence is to the received data. When two extensions make use of the same subsequence of length equal to the channel memory, only one sequence is retained (associated with j' above); the others are discarded. This is denoted as Maximum Likelihood Sequence Estimation (MLSE), as described by G. Ungerboeck, "Adaptive Maximum-Likelihood Receiver for Carrier-Modulated Data-Transmission Systems", IEEE Trans. on Comm., Vol. 22, No. 5, May 1974, pp. 624–636, incorporated by reference herein in its entirety. In this manner the number of candidate sequences is kept manageable. In order to administer these extensions and comparisons, the state (j, above) of the channel memory is defined. Any candidate sequence passing through a given state represents a hypothesis that the channel memory was composed of the symbols listed in the state description at that sample time (τ, above).

A convenient way to represent the states is to identify them as permutations of the possible transmitted symbol sequences. The length of the permutation is equal to the channel memory length less one, L−1. For example, for 8-PSK (M=8) and L=3, the state label would be represented by 2*3=6 bits, and the resulting number of states is 64. As an example, assume that the symbol $010_2$ were sent, followed by symbol $110_2$, and then finally symbol $b_2b_1b_0$. Then state $010110_2$ should exhibit a very high metric in the search process in extending sequences using possible values of $b_2b_1b_0$.

A commonly used variation of MLSE is to only search over sequences of a limited length. The intersymbol interference (ISI) energy which remains is accounted for by canceling it using per survivor DFE (decision feedback equalization). The full channel length is $L_h$, while the MLSE length is denoted L. The number of DFE channel taps is then $L_h$−L. This arrangement is sometimes referred to as Decision Feedback Sequence Estimation (DFSE).

Note that the filter taps used for reconstruction can be fixed at the beginning of a time slot, and need not be adaptive during the time slot. This is but one distinction between the teachings of this invention and the systolic decision feedback equalizer (DFE) described in the above-referenced Chakraborty et al. publication: "A systolic array realization of the adaptive decision feedback equalizer", Signal Processing, Vol. 80 (2000), No.: 12, pp. 2633–2640. Another distinction relates to the fact that the DFE need not employ a trellis search.

Figure 1:
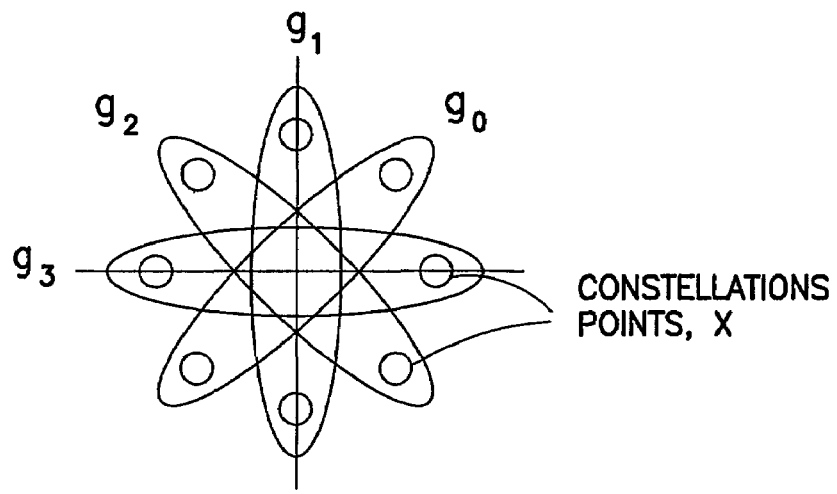
FIG. 1 is a diagram showing partitioning of an 8-PSK constellation using J=4, where in the trellis state, instead of a symbol being one of eight, it becomes a symbol from one of four groups (reduced states), where one of the symbols of the group is ignored as being very unlikely.

It is useful to reduce the number of states that are implemented. This can be done by labeling the states as permutations of groups (g) that the symbols could have been chosen from, as in FIG. 1. These groups are determined by partitioning the symbol constellation (see, for example, M. Eyuboglu and S. Qureshi, "Reduced-State Sequence Estimation with Set Partitioning and Decision Feedback", IEEE Trans. on Comm., Vol. 36, No. 1, January 1988, pp 13–20, incorporated by reference herein in its entirety). Because there are fewer groups than symbols, the number of permutations and states is thereby reduced. For example, if L=3 and each group contains two symbols ($J_1=J_2=4$ using Qureshi notation), so that there are 4 groups, then the number of states is $4^{L-1}=16$, as opposed to 64. The performance loss is minimized by maximizing the distance within the constellation between symbols in the same group, making it unlikely that a received sample will be associated with an incorrect element of a group rather than the correct element. The number of symbols has not been reduced, however, so it is still necessary to extend every sequence using every one of the M symbols in the constellation.

It is also desirable to obtain soft output corresponding to every coded bit sent by the channel coder of the transmitter. This is done by taking a difference of cumulative metrics, which is related to the likelihood ratio of the bit of interest being a one versus a zero (reference maybe had in this regard to W. Koch and A. Baier, "Optimum and Sub-Optimum Detection of Coded Data Disturbed by Time-Varying Intersymbol Interference," IEEE Globecom 1990, pp. 1679–1684, incorporated by reference herein in its entirety). For the presently preferred embodiment of the equalizer 10 it is desirable that the equalizer 10 search for the best cumulative metric associated with a transmitted one versus the best metric for a transmitted zero, take the difference, and then present the difference as the soft output soft. For M=8, there are three coded bits per received sample y and thus three soft values. These soft values are calculated after all of the energy corresponding to a given symbol has entered the equalizer 10. This results in producing the soft values soft associated with symbol $s_{k-(L-1)}$, after receiving symbol $s_k$. Because of the operation of reducing the number of states, the possibility may arise that there are no cumulative metrics observed by the equalizer 10 with an associated path history of a '1', for example, at history position k−(L−1), bit i (for M=8, there are 3 bits at each symbol position, i=0, 1 or 2). In this case, the soft value is substituted. This substitution preferably reflects the probability of the bit in question.

The equations above can be extended as follows in order to obtain soft values:

```
For each sample (y) received
    For each state (k)
        For each state (j) and transition (m) that can lead to this
        state
            For each bit position (n) in the symbol
                b = history_j<<(log_2 M)*(L-1)+n
                C_0(n) = max_{b=0} C(j,m)
                C_1(n) = max_{b=1} C(j,m)
        For each bit position (n) in the symbol
            if (soft(τ −_τ_m,n) exists)
                soft(τ −_τ_m,n) = C_0(τ,n)−C_1(τ,n)
            else
                soft(τ −_τ_m,n) = substitute(τ −_τ_m,n).
```

The original descriptive equations are sufficiently general to include the possibility of reduced states with the addition of an additional internal loop. The additional internal loop would read "For each transition (m) which can lead to this state from state (j)."

The approximation of the MAP soft values may be developed using, for example, the approach of W. Koch and A. Baier, "Optimum and Sub-Optimum Detection of Coded Data Disturbed by Time-Varying Intersymbol Interference," IEEE Globecom 1990, pp. 1679–1684. In Equation 15 of Koch and Baier it is pointed out that: $-\ln(e^x+e^y)=\min(x,y) -\ln(1+e^{|y-x|})$, so that the log of the sum may be approximated by using a minimum operation. When a departure from exactness is made, many alternatives are possible. In the presently preferred embodiment of this invention the natural log (ln) and exponential (exp) functions have been eliminated in favor of using the above-shown max( ) operations, i.e., $C\_0(n)=\max_{b=0} C(j,m)$, and $C\_1(n)=\max_{b=1} C(j,m)$. Note in this regard that max( ) and min( ) are the same operation with the exception of the sign of the value being tested.

For the purposes of this invention, in a presently preferred embodiment the soft assignments: (soft(τ−_Σ_m,n)=C_0(τ, n)−C_1(τ,n), soft(τ−_τ_m,n)=substitute(τ−_τ_m,n)) are considered to be or to represent an approximation of the maximum a posteriori (MAP) probabilities.

Figure 3A:
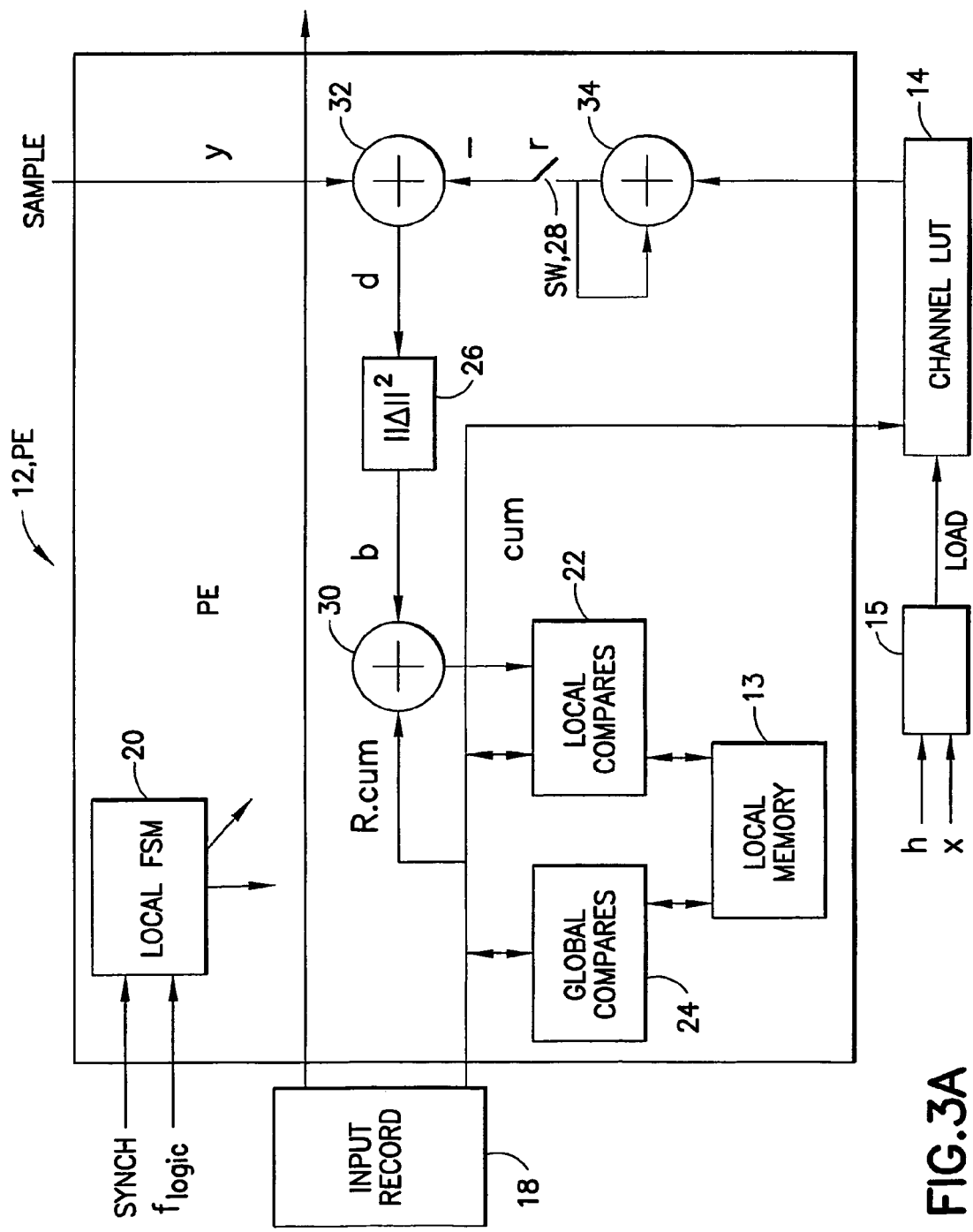

At this point it will also be useful to provide a short discussion related to the existence of cumulative values for the soft metric calculation. The soft values are calculated as the difference between two cumulative values. Those two cumulative values are approximations of the probability of a "1" and the probability of a "0" (see, for example, Equation 14 of Koch and Baier). In a reduced state sequence estimator (RSSE), one of these probabilities may not have been stored by the algorithm, i.e., no value exists for the algorithm to use. This situation can occur when one of these event probabilities (for example, the event "0") is so low that all of the surviving paths only contain information about the other event (in this example, the event "1"). This lack of information is not important to performance because it only occurs in unambiguous cases. However, one must still supply the decoder with an appropriate soft value (in this example, the soft value would strongly favor a "1" in the decoding process). There are a number of ways to substitute an appropriate soft value. One technique is referred to as DFsoft, and is explained in commonly assigned U.S. patent application Ser. No. 09/928,927, filed Aug. 13, 2001, "Soft Bit Computation for Reduced State Equalizers", Andrei Malkov, Heikki Berg, Pekka Kaasila, Kiran Kuchi and Jan Olivier, incorporated by reference herein in its entirety. In the DFsoft approach, the reference sample, r, of FIG. 3A is computed for each of the constellation points, x (see FIGS. 1 and 11A). The intersymbol interference due to earlier symbols is approximated by using the path history with the largest metric. In an 8-PSK embodiment, each constellation point x has a one-to-one mapping to a 3-bit sequence. For the bit in question, the Euclidean distance between the nearest symbol with a "0" in that position is subtracted from the Euclidean distance of the closest x with a "1" in that bit position. This value is substituted for the missing soft value. In the example at hand, the symbol with a "0" in that position would be quite distant, and a metric favoring "1" strongly would be created.

The following description is intended to aid the reader in visualizing how the algorithm is partitioned over various computational elements. This is an important step in the hardware design, as it identifies the required computational units and how the data moves between the computational units. The pseudocode provided below illustrates in detail the algorithmic steps.

In the presently preferred embodiment of this invention the equalizer 10 is embodied in an integrated circuit, more specifically in an ASIC. As such, a number of practical considerations arise related to gate count, silicon area, clock rate, power consumption and flexibility (among others). The presently preferred embodiment is influenced at least in part by the VLSI Viterbi algorithm proposals by Lloyd and Gulak, as modified so as to provide a moderate clock rate and a minimization of integrated circuit area. Embodiments of the invention also preferably provide a scalable architecture that may be configured programmatically to realize various numbers of states at run time.

Three essentially generic Viterbi decoder architectures were studied in Lloyd. These were: (a) a purely serial processor, much like a DSP; (b) the serial processor with some additional numeric components; and (c) a parallel processor, with one processing element (PE) per trellis state (shown in FIG. 3 of Lloyd).

Additional architectures are presented by Gulak. A most interesting one for extension to the teachings of this invention is the linear array. This is a systolic array in which there is one PE for every state, and where data copies are circulated between the PEs. When describing the instant invention, use is made of the term "Record" for the data copies that are circulated between the PEs (from the Pascal programming language). For a fully connected trellis, all of the PEs are simultaneously busy operating on Records (i.e., on data copies).

Figure 2A:
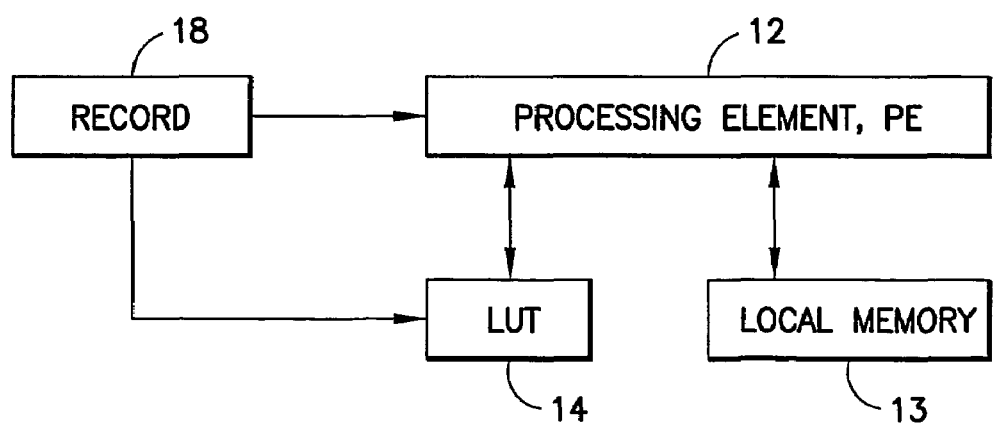
FIGS. 2A, 2B and 2C, collectively referred to as FIG. 2, are a block diagram of a single PE and associated components, a block diagram of a linear array of PEs, and a block diagram illustrative of the Systolic Equalizer Architecture in accordance with an embodiment of the invention, where there is one PE per state.
Figure 2B:
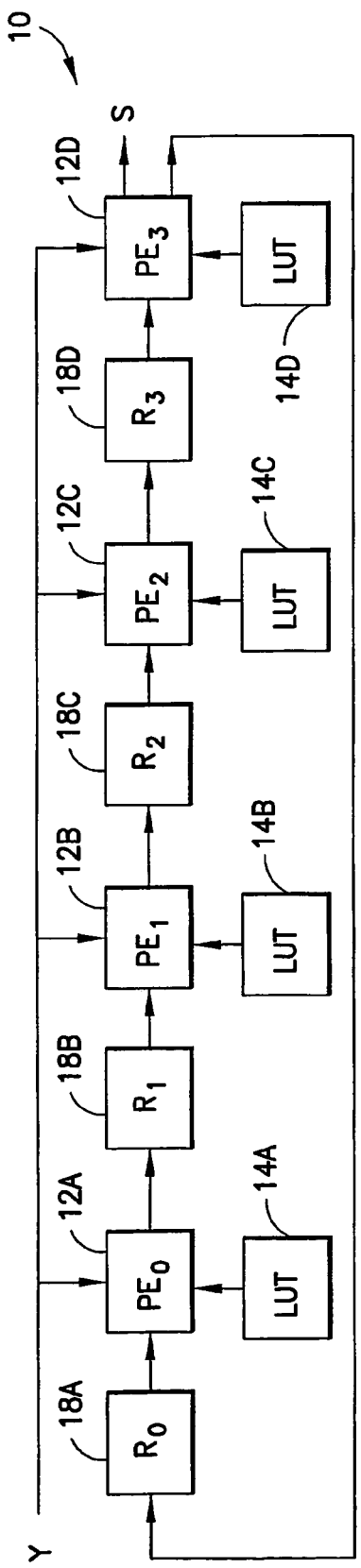
Figure 2C:
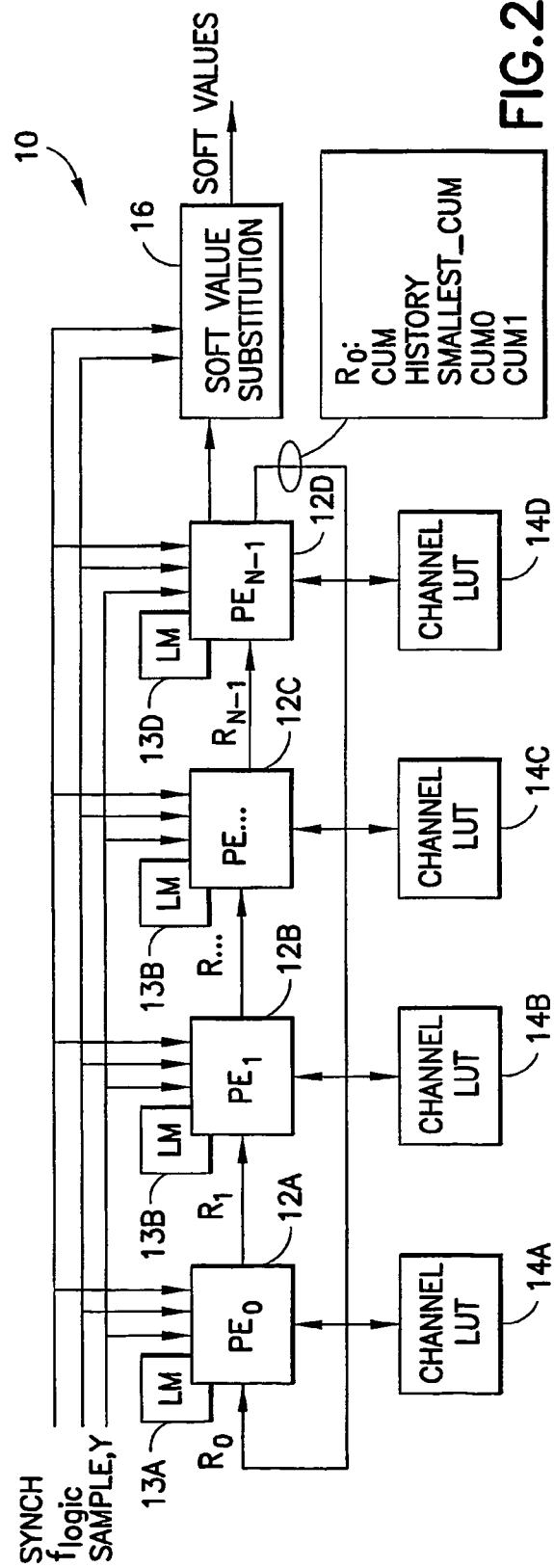

FIG. 2A illustrates a parallel processing element (PE 12) having an associated Local Memory (LM) 13, a Channel LUT 14 and an input Record 18. FIG. 2B shows a linear array of the PEs 12 (12A–12D), assumed in this case to have the LM 13 internalized. In sequence, the input sample y arrives, the Records 18A–18D are processed in parallel by the PEs 12A–12D, the Records 18 shift forward (form left to right in this embodiment) and are processed again, and after all PEs 12 have processed all Records 18, the soft values (s) are output. FIG. 2C is another view of the equalizer 10 with data circulating between the linear array of PEs 12 (N PEs, $PE_0$ to $PE_{N-1}$, designated for convenience as 12A–12D), in a manner somewhat similar to that shown in FIG. 3 of Lloyd and in FIG. 4 of Gulak. However, this invention further provides the Channel LUT 14 coupled to each PE 12 (Channel LUTs 14A–14D, respectively), and employs a soft value substitution unit 16, coupled to the right-most PE 12D of the linear array, in regards to the presently preferred embodiment of the channel equalizer 10.

The circulated data (Records 18) include parameters: Cumulative, History, smallest_Cum, cum0 and cum1, as discussed below. Each PE 12A–12D is assumed in this embodiment to include the Local PE Memory (LM) 13A–13D, respectively. Common inputs to the equalizer 10 include a synchronization signal (synch), a clock signal ($f_{logic}$), and the input samples y of the signal received from the channel that is to be equalized.

The basic steps in the operation of the equalizer 10 are as follows:
Obtain the channel estimate h and calculate the Channel LUT 14;
Initialize the records (R) and PEs 12;
For each received data sample:
  normalize the cumulative metric in PE Local Memory (LM) 13;
  Repeat N times
    Each PE accepts the record at its input
    The record is processed, PE LM 13 is updated and some record fields may be overwritten.
    shift the record from the PE input to the PE output
  compute the soft output values
  wait for the next burst The Channel LUT 14 stores all possible products between the channel taps and constellation points x. For example, if the total estimated channel length, $L_{h}=6$ and M=8, then there are 48 such complex products stored in the Channel LUT 14. The element responsible for loading of the Channel LUT 14 is shown in FIG. 3A as the unit 15.

The synch signal is used to initialize and activate the PEs 12 for each record. Also the synch signal controls the computation of the soft values from the record $R_{N-1}$ after processing of the sample is completed. The $f_{logic}$ clock represents the highest clock frequency required for operation of the PEs 12 so as to complete their computations within the allocated interval of time. As will be shown below, a suitable clock frequency maybe about 30 MHz.

Figure 11A:
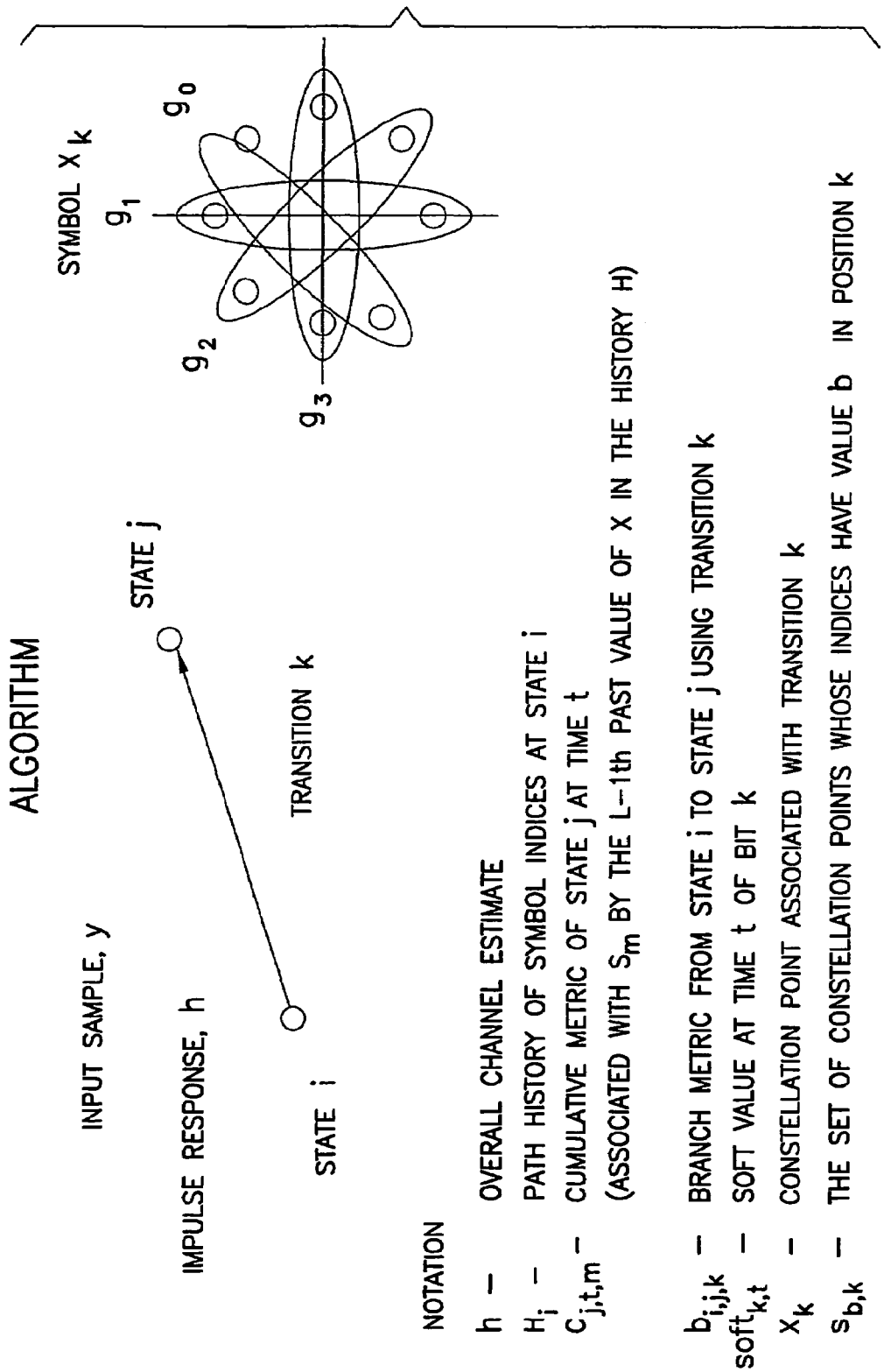
Figure 11C:
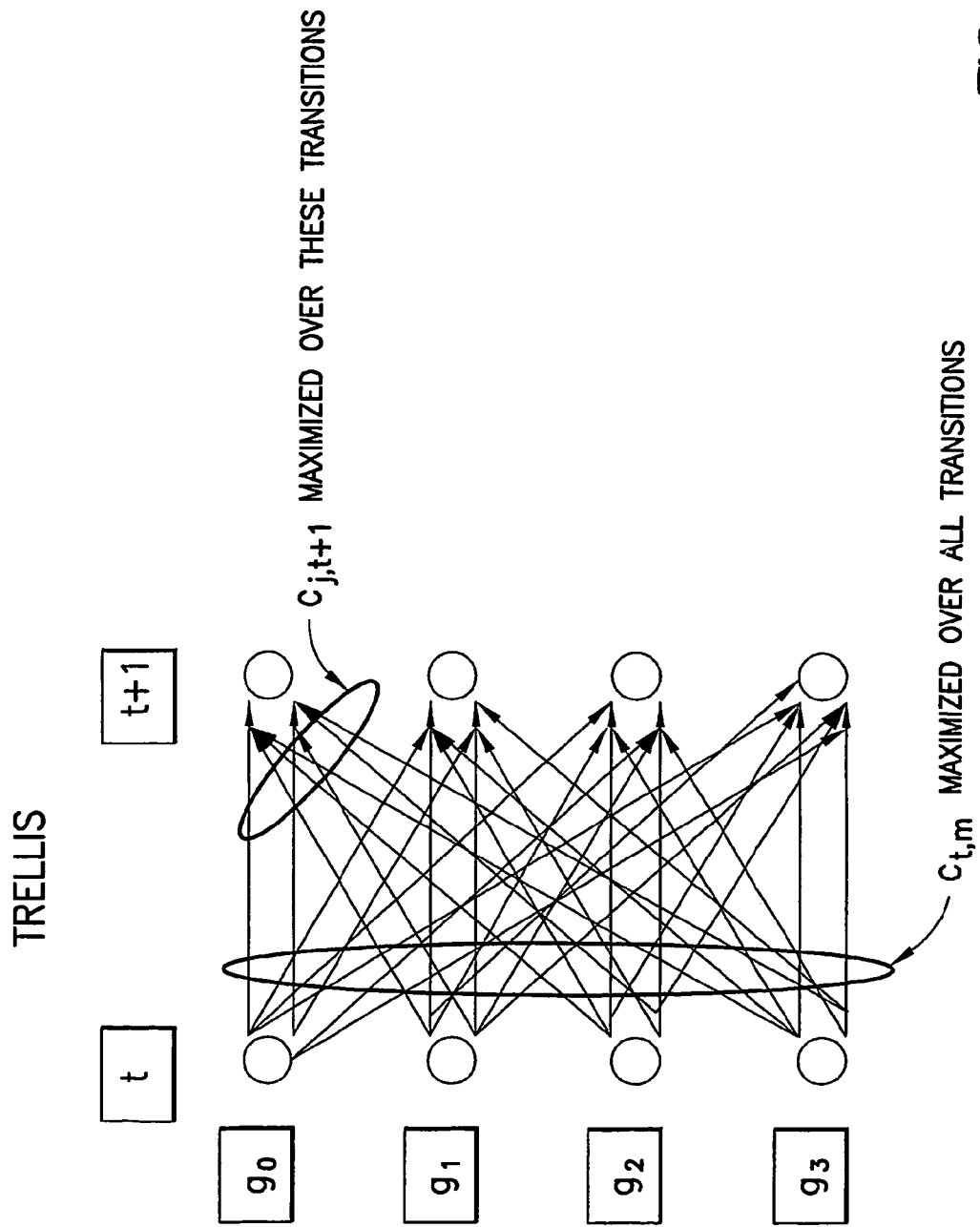
Figure 11D:
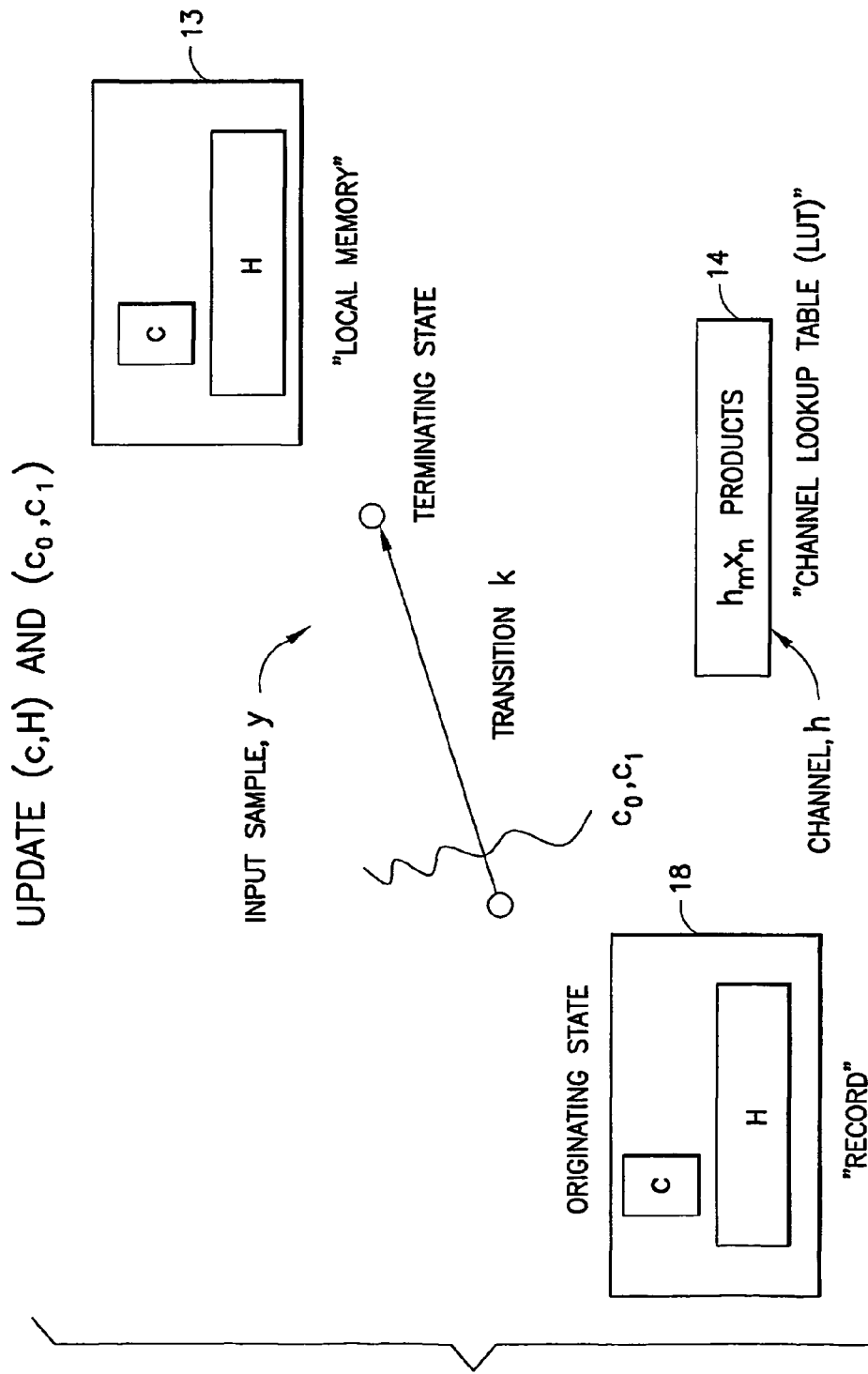

FIGS. 11A, 11B, 11C and 11D are also useful in explaining the operation of the equalizer 10. FIG. 11A shows the overall algorithm flow, the transition k from state i to state j given an input sample y and impulse response h for a constellation point $x_k$ associated with transition k, as well as a definition of the notation. FIG. 11B shows a set of presently preferred equalizer equations. FIG. 11C shows a four state trellis and the maximization of the cumulative metric assuming constellation groups $g_0$ through $g_3$, as in FIG. 1. FIG. 11D shows the update procedure for the PE 12 Local Memory 13 and Channel LUT 14, based on the input Record 18.

The internal components of a PE 12 are shown in FIG. 3A. The PE 12 includes, in addition to the aforementioned LM 13, a Local Finite State Machine (FSM) 20, a local compares block 22, a global compares block 24, a magnitude squares block 26, a switch (SW) 28, and three summation nodes 30, 32 and 34. The following functions are carried out inside the PE 12 under the control of the local FSM 20. Before the processing of a sample begins, the cumulative metric (cum) value stored in the LM 13 is normalized. Also, the record R, designated Input Record 18, is updated based on the data in LM 13. Then repetitive processing of records begins as was explained above with regard to FIG. 2. The processing of the Input Record 18, such as one obtained from the adjacent PE 12 of FIG. 2, is carried out by an examination of each possible trellis transition from the state represented by R to the state represented by the PE 12. The path history associated with the trellis transition under consideration is used to address the Channel LUT 14. Output values from the Channel LUT 14 are successively summed in node 34 until the reference value, r, has been formed. At this time SW 28 is closed, and r is subtracted from the sample, y, in node 32, to obtain the difference d. The magnitude square of d is taken in block 26 to obtain the branch metric, b. The branch metric b is added in node 30 to the R_cum value from the record, R, to obtain a new cumulative metric (cum) for consideration. The new cum is passed to the Local Compares block 22 which may make changes to both the record R 18 and the LM 13. At the same time the Global Compares block 24 operates and may make different changes to R 18 and the LM 13.

The operation of the PE 12 may be summarized in a general sense as follows:
For each Record 18 arriving at the PE 12 input:
  For each parallel transition of the trellis (illustrated in FIG. 11C), the PE 12:
    (a) calculates the reference, r, where in the presently preferred, but non-limiting embodiment the Channel LUT 14 is used for this purpose;
    (b) computes a difference d=y−r;
    (c) squares the difference value, $b=|d|^2$;
    (d) adds this branch metric to the cumulative metric of the Record 18; and
    (e) examines the path history in the Record 18 and updates the Local Memory 13 path history and the Local Memory 13 metrics as required;
  carries out the global compares and updates the Record 18 and Local Memory 13 as needed.

Figure 4A:
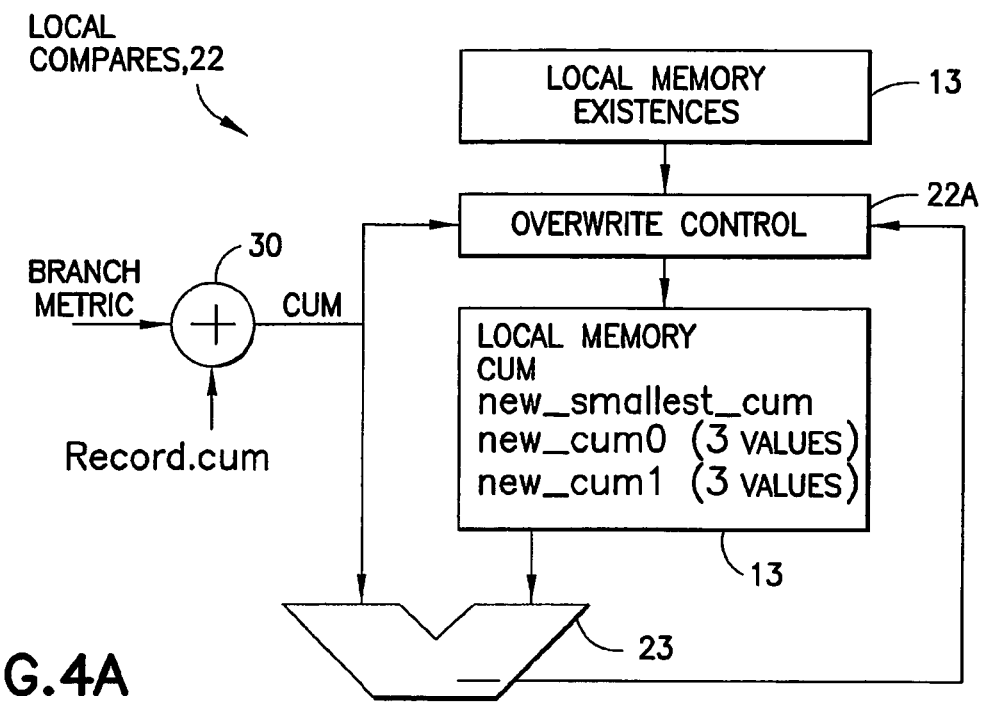
FIGS. 4A and 4B are block diagrams illustrative of the Local Compares block of FIG. 3A.
Figures 1, 4B:
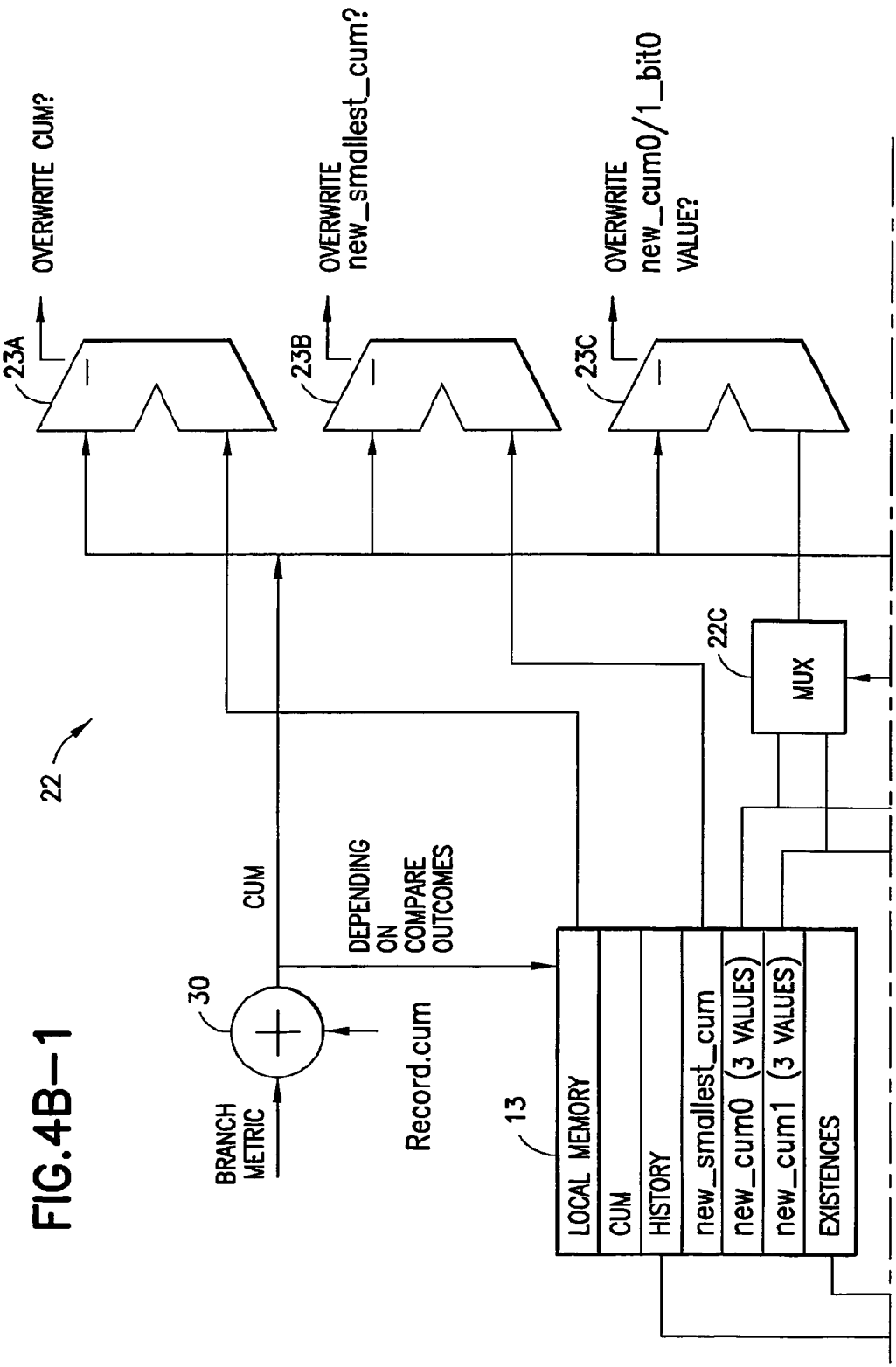

The Local Compares block 22 is shown in FIGS. 4A and 4B. The function of the Local Compares block 22 is to pose the following inquiries, and to overwrite data as needed according to the results:
Is R_cum (Record Cumulative) greater or less than LM.13 cum (cum>?LM.cum)
cum<? LM.new_smallest cum.
cum>? LM.new_cum0_bit 0, 1, or 2
cum>? LM.new_cum1_bit 0, 1, or 2.

If any of these tests is affirmative, as indicated by comparator 23, shown as comparators 23A–23E in FIG. 4B, then the previous value in the LM 13 is overwritten under control of the overwrite control block 22A. The cum0 and cum1 tests are contingent on a value existing there. Note in FIG. 4B that a decode unit 22B can be used to decode the history and existences outputs of the LM 13, and the decoded output is used as a selection input to three multiplexors (MUXes) 22C–22E thereby enabling, for this non-limiting embodiment, three bit-specific tests via comparators 23C, 23D and 23E.

Figure 5A:
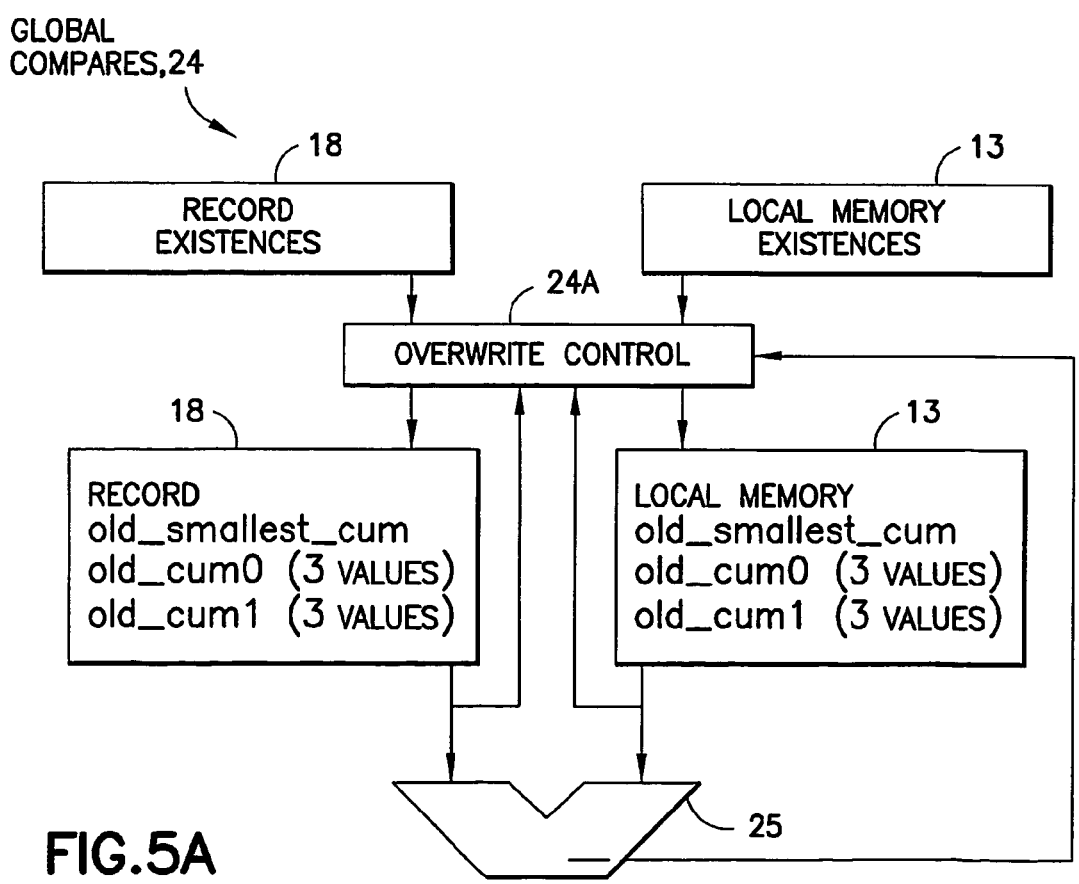
FIGS. 5A and 5B are block diagrams illustrative of the Global Compares block of FIG. 3A.
Figure 5B:
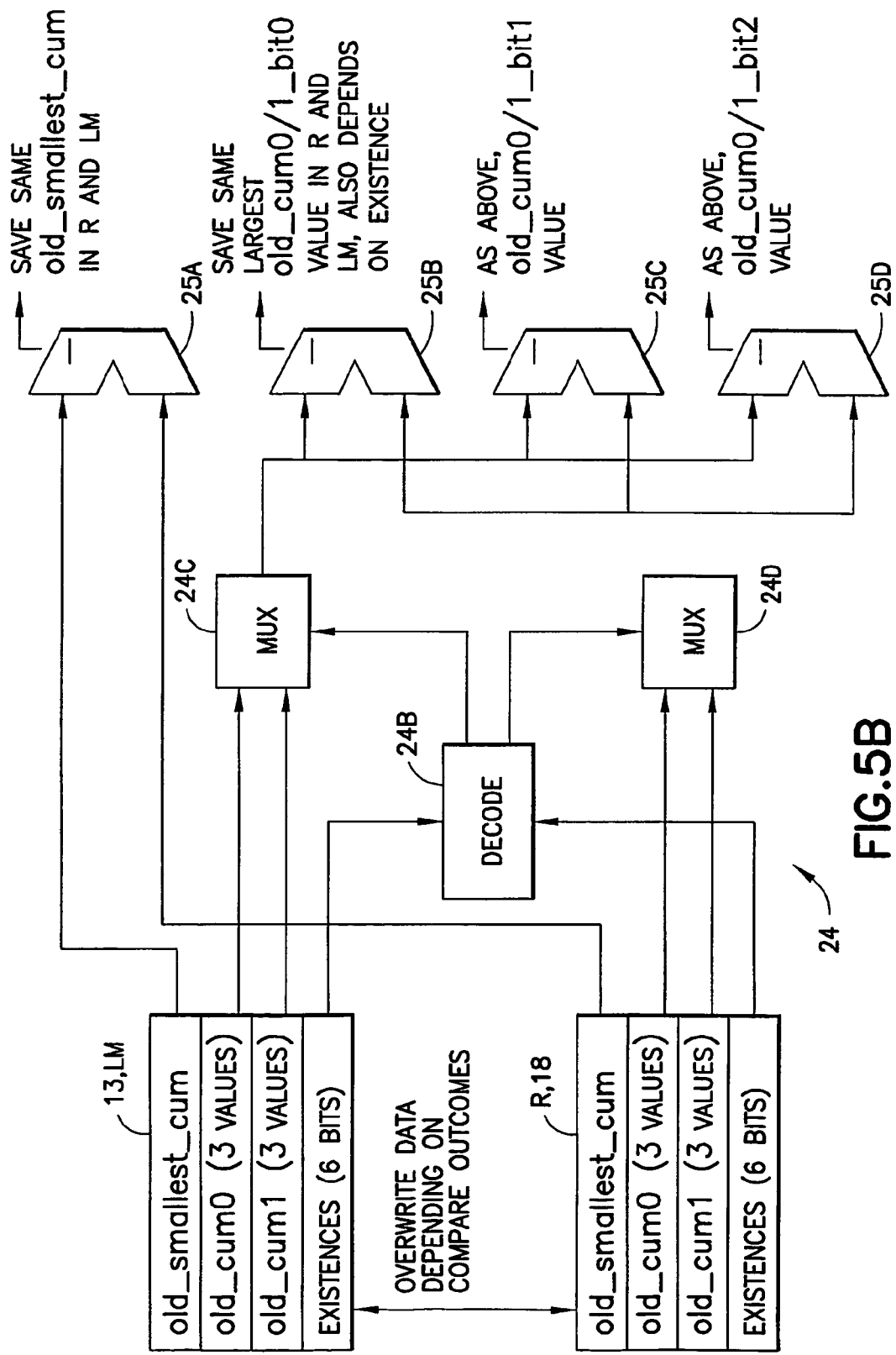

The global compares block 24 is shown in FIGS. 5A and 5B. The purpose of the global compares block 24 is to search through the PEs 12 and determine with comparators 25A–25D, shown collectively as comparator 25 in FIG. 5A, several globally large or small values. The smallest metric is located for normalization purposes, while the best cum0 and cum1 metrics are located to compute the soft values (s). This occurs in cooperation with a decode block 24B, driven by LM 13 and R 18 existences values, and MUXes 24C and 24D. After the processing of a sample, the Local FSM 20 directs the placement of the LM.new_smallest_cum value into the LM.old_smallest_cum. During the operation of the Global Compares block 24 this value moves into the Record 18 being processed if it is the smallest in value. As each PE 12 processes successive Records 18, the LM_smallest_cum value takes on the minimum value over all PEs 12. It is only necessary to activate the Global Compares cum0/cum1 operations for $R_{N-1}$, which visits each PE 12 once.

Further with regard to the operation of the Global Compares block 24, after each sample period the extreme metric values need to be found for the purposes of normalization and computing the soft values. These values should be the extremes as searched over all of the PEs 12. The values which are to be searched are not, however, set until all of the records have been processed. A direct solution would create a centralized global searcher which could access all of the PEs 12. However, this approach would require a star shaped bus or a shared bus to be incorporated into the systolic array design, and would greatly diminish the benefits of the algorithm realization on the presently preferred locally-connected structure. It is thus preferred to obtain the desired values after a one sample delay using a serial search. The one sample delay has no impact on performance, as the Records 18 are already circulating in a serial fashion in order to compute the metrics and path histories. The search is accomplished by adding the cum_old type variables to the Records 18 and Local Memories 13, and using the Global Compare 24 function. N values are searched to achieve the function. This can be achieved by only activating the Global Compare 24 function in the rightmost PE 12 (all N Records 18 pass through every PE 12 in the preferred embodiment). As such, it can be appreciated that one may save power and gates by providing the Global Compares 24 block in only the right-most PE 12. Alternatively, if provided in each PE 12 the Global Compares 24 could be powered down if not in use, or until use is required.

Figure 9A:
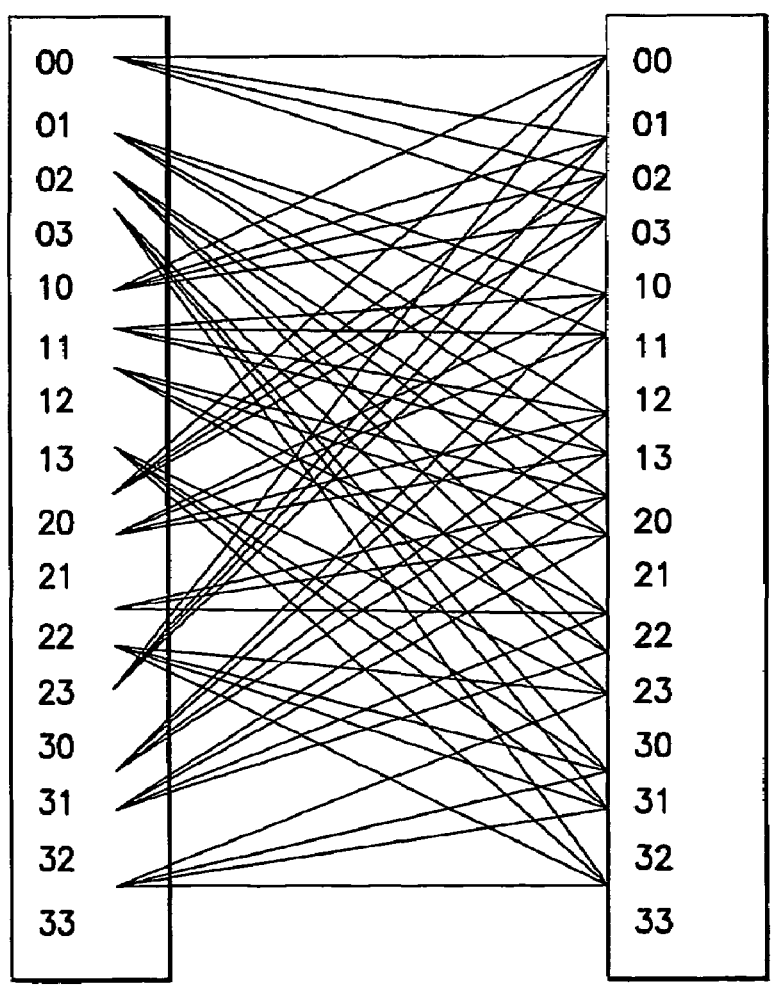
Figure 9B:
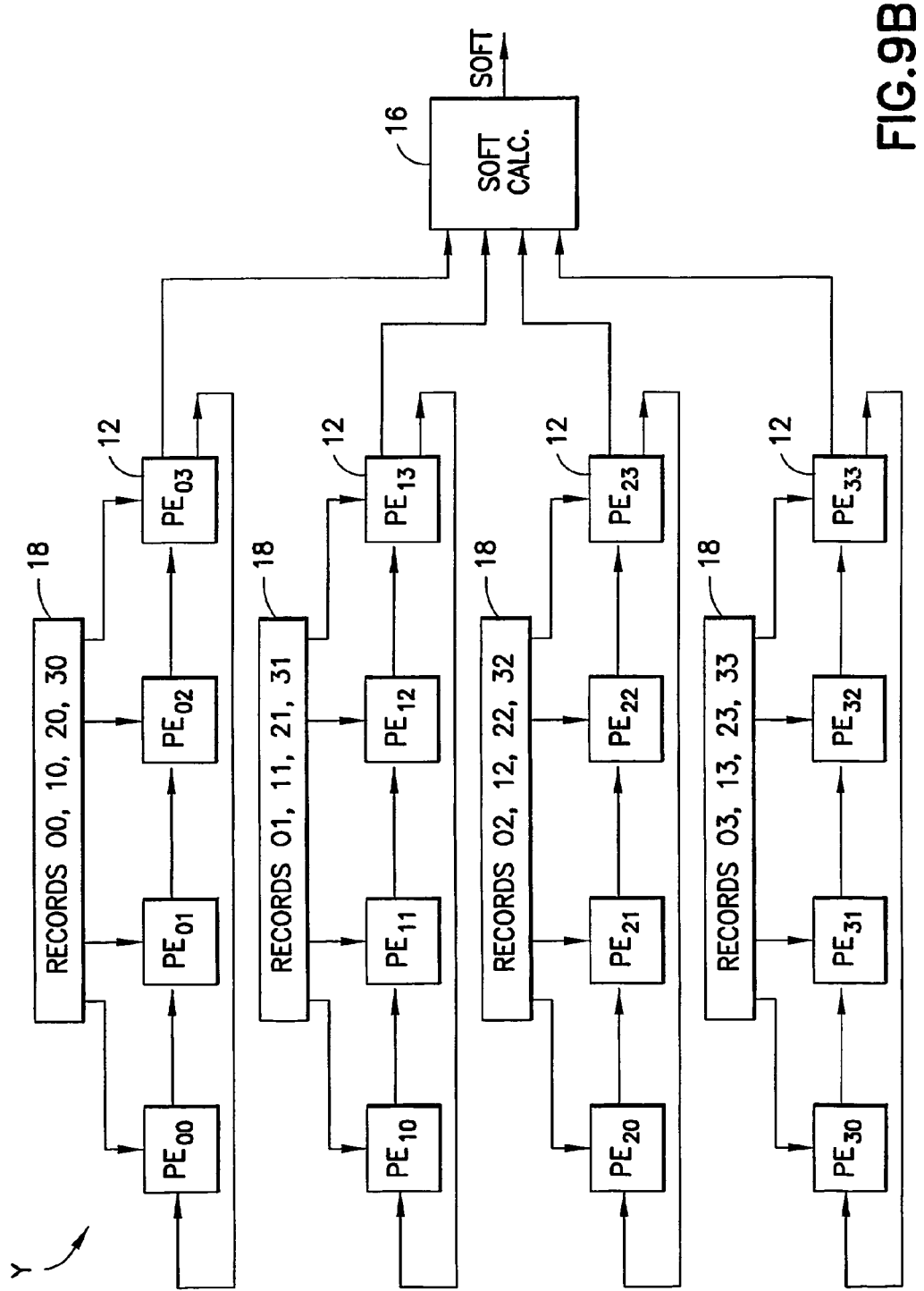
FIG. 9B shows a block diagram of the 16 state systolic equalizer, as also shown in FIG. 6.

In certain embodiments, for example in FIG. 9B, a final comparison would be done in block 16 of FIG. 9B for the soft values. The normalization may be done locally in each sub-array (e.g., PE00,PE01,PE02,PE03), or in block 16 and communicated to the PE subarrays. Normalization per se in a Viterbi-type algorithm is a well-known step to reduce the number of bits needed to represent the cumulative metrics.

The foregoing discussion concerns both two state and four state equalizers 10. For a 16 state equalizer 10, the trellis is not fully connected as shown in FIG. 9A. This means that the components of the systolic equalizer 10 are not all busy if every state record circulates throughout the linear array. However, symmetry conditions exist in the 16 state trellis such that it can be realized using four banks of four element PEs 12. The following discussion pertains to the special requirements for the 16 state systolic equalizer 10, followed by a description of how to map many PEs 12 to a single PE using a higher clock rate. FIG. 9B is a block diagram of a systolic implementation of the 16 state equalizer 10, where there are four instances of the four PE linear array shown in FIGS. 2B and 2C, each operating in parallel to provide soft values (s) from the soft value calculation block 16. The Channel LUTs 14 are not shown in order to simplify the drawing.

Figures 6, 7:
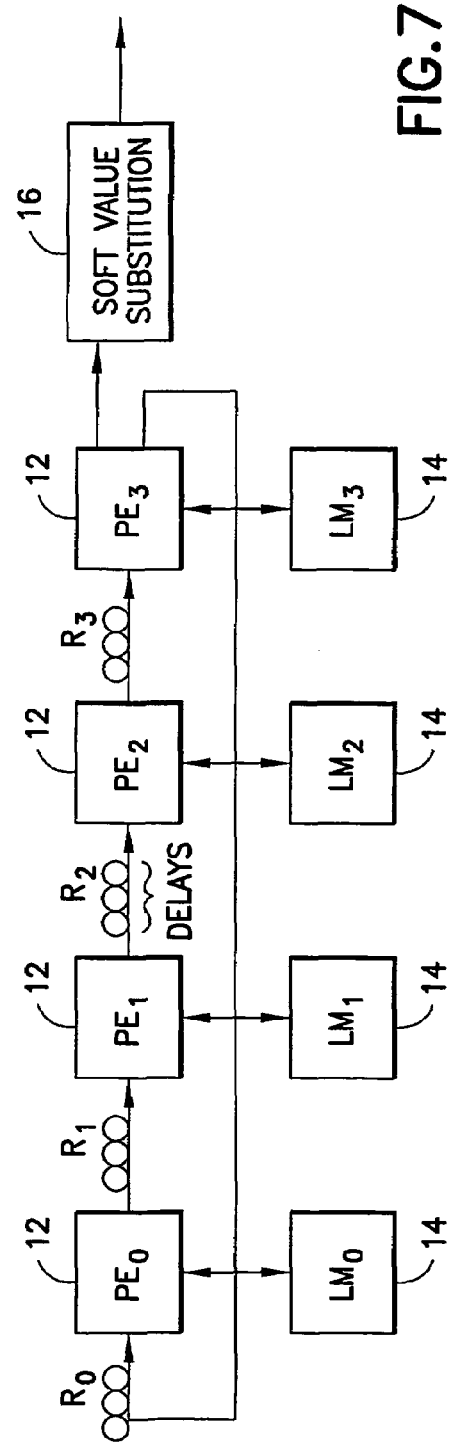
FIG. 6 is a representation of the systolic architecture for N=16.
FIG. 7 is a diagram illustrative of a mapping of a four state architecture to one PE in accordance with an embodiment of the present invention.

Examination of the trellis for the 16 state equalizer 10 of FIG. 9A shows that it may also be implemented with a linear array as shown in FIG. 6. The 16 state linear array is composed of four linear PE arrays, as shown in FIG. 9B, where each linear array forms one row of the table shown in FIG. 6. During processing of a sample y, a Record 18 exiting from the right-most PE 12 re-enters at the left-most PE 12 in the same row. In this manner the 16 state equalizer 10 uses four times the PEs 12 and four times the Records of the four state equalizer shown in FIGS. 2B and 2C. After the sample y is processed, the soft values at the rightmost PE's are gathered by the comparison unit 16 for reduction to a single soft value per bit.

After the sample y has been processed, each PE 12 updates the Record memory adjacent to it (as before, except that the PE 12 label generally does not match the Record label). The Records 18 are then circulated through the entire array so that they are available to a PE where they are needed. Also, an additional element of delay in finding the smallest cum is preferably used.

The four PEs 12A–12D of FIGS. 2B and 2C may be mapped to a single PE operating at a higher clock rate by adding memory (see Pirsch in this regard). If one assumes that the LM 13 is removed from each PE 12, and that delays are added between PEs 12, one obtains the embodiment of FIG. 7, where the circles between PEs 12 represent delay elements.

Figure 8:
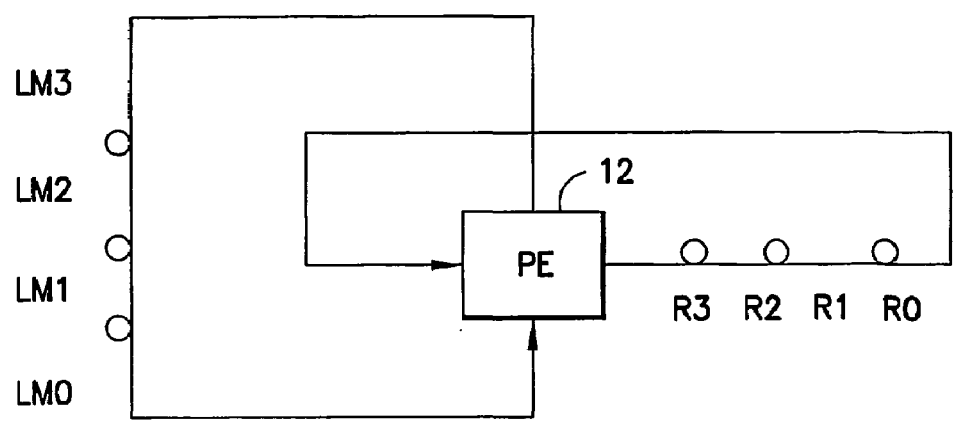
FIG. 8 is a diagram showing how one PE can implement the four state equalizer.

In this case it is desired that PE0 processes R0, PE1 processes R1, PE2 processes R2 and PE3 processes R3, followed by shifting the records which results in PE0 processing R3, PE1 processing R0, PE2 processing R1 and PE3 processing R2, followed by shifting the records and PE0 processing R2, PE1 processing R3, PE2 processing R0 and PE3 processing R1, followed by shifting the records and PE0 processing R1, PE1 processing R2, PE2 processing R3 and PE3 processing R0, and then outputting the delayed soft values from block 16. This can be accomplished by shifting the LMs 13 (which actually define the identity of the PE 12) against the proper Records 18. The result is the equalizer embodiment shown in FIG. 8.

According to the schedule sequence discussed above, after R0–R3 have been processed once, the Records 18 are shifted backwards against the direction of the arrow one space so that LM0 lines up with R3 at the beginning of the processing of the next four record times. Since one PE 12 in the four PE embodiment of the four state equalizer 10 processed each record four times, when using one PE 12 as in FIG. 8 there are a total of 16 record processing events.

A presently preferred algorithm for use in the systolic equalizer 10 architecture is now described.

The following description includes variable declarations and pseudocode for the burst by burst operation of the systolic equalizer 10. All of the operations shown in the pseudocode are implemented by the hardware elements discussed above.

Definitions:

Constants

| | | |
|---|---|---|
| N | Number of States | 2, 4, or 16 |
| NP | Number of PEs | 2, 4 or 16 (or 1) |
| NT | Number of Member Symbols in Partition | 4, 2 or 2 |
| LH | Length of History | 6 |
| L | Number of MLSE taps | 2, 2, or 3 |
| M | Modulation Level | 2 or 8 |
| Ns | Number of samples processed in a burst | 3 + 58 + 26 + 58 + 3 = 148 |
| Nsmall | Init. value | −1000 or the like |
| Nbig | Init. value | 1000 or the like |

Variable Names

| Name | Meaning |
|---|---|
| R | Record Unit 18 |
| LM | Local Memory 13 |
| h | channel estimate |
| x | constellation points |
| C_LUT | Channel Lookup Table 14 |

Operation Names

| | |
|---|---|
| Mc | Complex Multiply |
| Mr | Real Multiply |
| Ac | Complex Addition |
| Ar | Real Addition |
| T | Transfer a value to a register |

Record Unit 18 Structure
  Cum 16 bits
  History 15 bits
  old_cum0 (3 values)
  old_cum1 (3 values)
  smallest_cum 16 bits
  cum0_exists (3 bits)
  cum1_exists (3 bits)

Each record 18 has a need for nine, 16 bit words and two, 3 bit words. There is one record per state.

Local Memory 13 Structure
  Cum 16 bits
  History 15 bits
  new_smallest_cum 16 bits
  old_smallest_cum 16 bits
  new_cum0 (3 values)
  new_cum1 (3 values)
  old_cum0 (3 values)
  old_cum1 (3 values)
  cum0_existences (3 bits)
  cum1_existences (3 bits)

Each LM 13 employs 24, 16 bit words and six, 3 bit words. There is one LM 13 per state.

Memory
  Altogether, this embodiment of the systolic equalizer 10 uses 33, 16 bit words and eight, 3 bit words per state.

| N States | 16 bit words | 3 bit words |
|---|---|---|
| 2 | 66 | 16 |
| 4 | 132 | 32 |
| 16 | 528 | 128 |

// Partition holds the complex symbol values for this state.
Selected from J1 partitions of 8-PSK

```
For Each Burst:
    // initialize registers in Records (R) and Local Memories (LM)
    for (i=0;i<N;i++) {
        R(i).Cum = Nsmall;
        R(i).History = 0;
        R(i).old_cum0 = Nsmall;
        R(i).old_cum1 = Nsmall;
        R(i).smallest_cum = Nbig;
        R(i).cum0_exists = (0,0,0);
        R(i).cum1_exists = (0,0,0);// opcount: 7 N T
    }
    for (i=0;i<N;i++) {
        LM(i).Cum = Nsmall;
        LM(i).History = 0;
        LM(i).new_smallest_cum = Nbig;
        LM(i).old_smallest_cum = 0;
        LM(i).new_cum0 = Nsmall;
        LM(i).new_cum1 = Nsmall;
        LM(i).old_cum0 = Nsmall;
        LM(i).old_cum1 = Nsmall; // opcount: 8 N T
    }
    // generate the Channel_LUT 14 using unit 15
    for (i=0;i<M;i++) {
        for (j=0;j<LH;j++) {
            C_LUT(i,j) = h(j)*x(i); // opcount: M Lh Mc
        }
    }
    // for each symbol
    for (is=0;is<Nsym;is1++) { // it is implied that all op counts in this loop are * Ns
        // normalize cumulative metrics
        for (i=0;i<N;i++) {
            LM(i).cum -= LM(i).old_smallest_cum; // N Ar
        }
        // compute soft
        // substitute values; may use the method explained by A. Viterbi, "CDMA
        Principles ofSpread Spectrum Communication",Addison-Wesley, 1995,
        eqtn 4.51, or any other suitable method, including DFsoft
        // r_dfe is a reference signal based on the jth constellation symbol at time
        is-(L-1)
        // d is the square of the distance from the received sample to r_dfe
        for (j=0;j<M;j++) {
```

-continued

```
                    d(j) = |y(is-(L-1))-r_dfe(is-(L-1),j)|²;
                }
                // best0 is the value of d with associated with a symbol with a 0
                in position k
                // best1 is the value of d with associated with a symbol with a 1
                in position k
                    for (k=0;k<Log2M;k++) {
                        best0(k) = min0(d,k);
                        best1(k) = min1(d,k);
                        sub_soft(k) = best1(j)-best0(j);
                    }
            for (i=0;i<Log2M;i++) {
                if(R(N-1).old_cum0_exists(i) && R(N-1).old_cum1_exists(i)) {
                    soft(i) = R(N).old_cum0(i) - R(N).old_cum1(i);
                }
                else {
                    soft(i) = sub_soft(i);
                }
            }
        // transfer some Local Memory 13 elements into Record 18 and initialize
        existence variables
        for (i=0;i<N;i++) {
            for (ib=0;ib<Log2M;ib++) {
                LM(i).old_cum0(ib) = LM(i).new_cum0(ib);
                LM(i).old_cum1(ib) = LM(i).new_cum1(ib);
            } // 6 N T
            R(i).cum = LM(i).cum;
            R(i).history = LM(i).history;
            R(i).old_smallest_cum = Nbig;
            LM(i).old_smallest_cum = LM(i).new_smallest_cum;
            LM(i).new_cum0_exists = (0,0,0);
            LM(i).new_cum1_exists = (0,0,0);
            LM(i).cum = Nsmall;
            LM(i).new_smallest_cum = Nbig; // 8 N T
        }
        for (ir=0;ir<N;ir++) { // for each record
            // below is in parallel if NP = N; operate each PE
            for (ip=0;ip<N;ip++) {
                for (it=0;it<NT;it++) { // for each parallel transition
        // N*N*Nt*T      rM = C_LUT(0,LM(ip).Partition(it));
                    rD = 0+j0;
                    for (ic=0;ic<LH-1;ic++) {
        //N*N*Nt*(Lh-1)*T   product=C_LUT(ic+1,R.History(ic+1));
        //N*N*Nt*(Lh-2)*Ac   rD += product;
                    }
        // N*N*Nt * 1 Ar   r = rD + rM;
        // N*N*Nt* 1 Ar    d = y(is) - r;
        // N*N*Nt* (2Mr+1Ar)  b = |d|²;
        // N*N*Nt* 1 Ar    c = R(ir) + b;
        // N*N*Nt* 1 T     cum = trunc(c);
        // N*N*Nt* 1 Ar    if (cum > LM(ip).cum) {
        //N*N*Nt* 2 T         LM(ip).cum = cum :
                        LM(ip).History = R(ir).History;
            }
                    if (cum < LM(ip).new_smallest_cum) {
            LM(ip).new_smallest_cum = cum;
        }
            if (R(ir).smallest_cum<LM(ip).old_smallest_cum) { //N*N*Nt* 1 Ar
    LM(ip).old_smallest_cum = R(ir).smallest_cum;
}
else {
    R(ir).smallest_cum = LM(ip).old_smallest_cum;
}
for (ib=0;ib<Log2M;ib++) {
        bit = R(ir).History >> bit_delay & 1;
        if (!bit) {
            if (cum>LM(ip).new_cum0(ib)) { //3* N*N*Nt* 1 Ar (Log2M=3 for 8-
PSK)
            LM(ip).new_cum0 = cum;
            new_cum0_exists(ib) = 1; // 3 * 2 T
        }
        }
        else {
            if (cum>LM(ip).new_cum1(ib)) {//3* N*N*Nt* 1 Ar
            LM(ip).new_cum1 = cum;
            new_cum1_exists(ib) = 1;
        }
        }
        if (!R(ir).old_cum0_exists(ib) && LM(ip).old_cum0_exists(ib))) {
```

-continued

```
        R(ir).old_cum0 = LM(ip).old_cum0(ib);
        R(ir).old_cum0_exists(ib) = 1; // this will not happen often
      }
      if (R(ir).old_cum0(ib)<LM(ip).old_cum0(ib) && R(ir).old_cum0_exists(ib)
&& LM(ip).old_cum0_exists(ib) ) {// N*N*Nt* 1 Ar
        R(ir).old_cum0(ib) = LM(ip).old_cum0(ib); // 3 * T
      }
      if (!R(ir).old_cum1_exists(ib) && LM(ip).old_cum1_exists(ib))) {
        R(ir).old_cum1 = LM(ip).old_cum1(ib);
        R(ir).old_cum1_exists(ib) = 1; // same for cum1, won't happen often
      }
      if (R(ir).old_cum1(ib)<LM(ip).old_cum1(ib) && R(ir).old_cum1_exists(ib)
&& LM(ip).old_cum1_exists(ib) ) {// N*N*Nt* 1 Ar
        R(ir).old_cum1(ib) = LM(ip).old_cum1(ib); // 3 * T
      }
    }
         }
       }
     }
}
```

Figure 12:
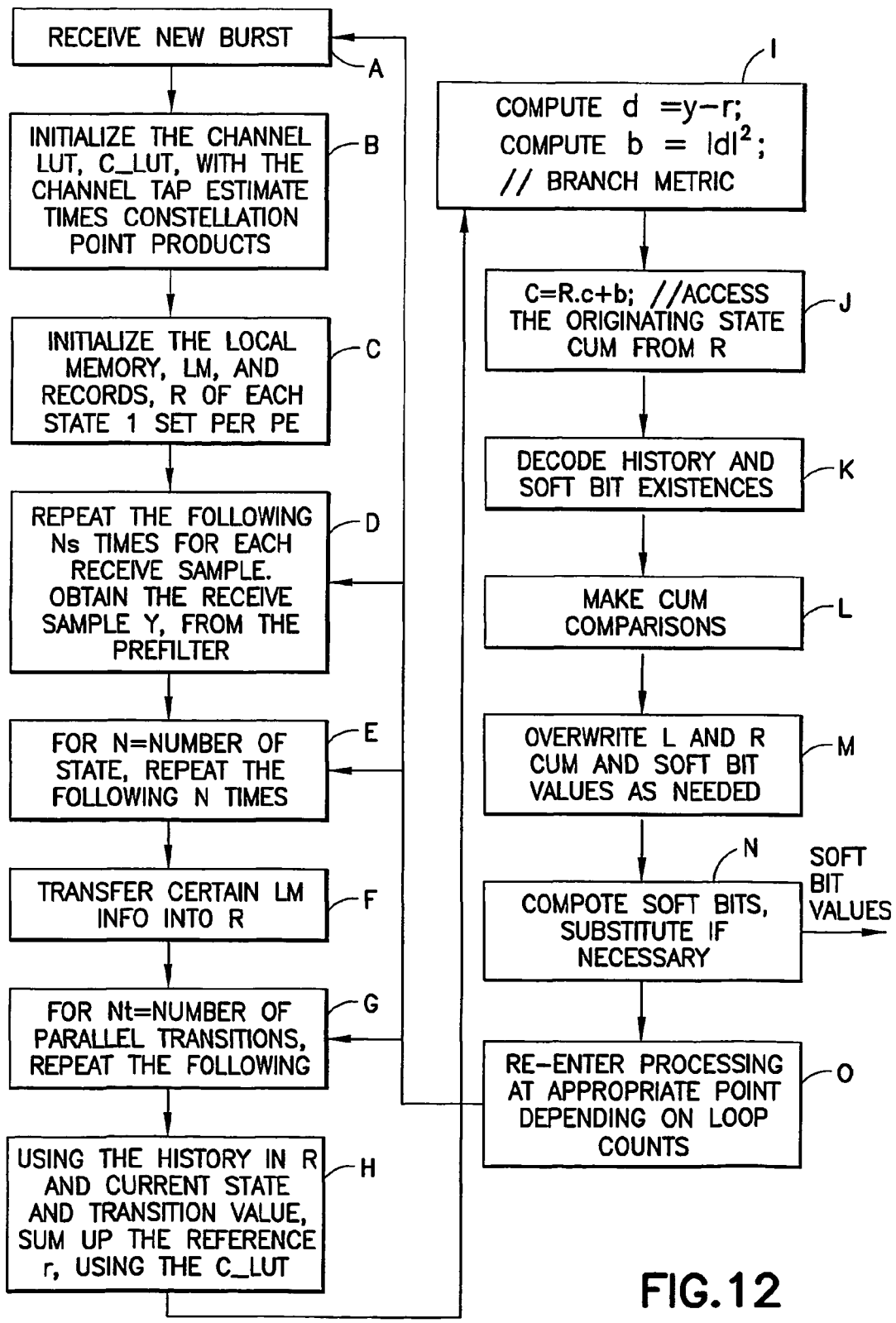
FIG. 12 is a logic flow diagram in accordance with a method of this invention.

FIG. 12 is a logic flow diagram in accordance with a method of this invention, as described above in reference to the pseudocode example. At Block A a new burst is received from the channel, and at Block B the Channel LUT 14 is initialized with the product of the channel tap estimates and the constellation points. At Block C the LMs 13 and Records 18 are initialized for each state. Block D represents an outer loop of Ns times for each received sample y from the prefilter 4. Block F represents a first inner loop of N, where N is the number of states. At Block F certain LM 13 information is transferred to the Record 18. Block. Block F represents a second inner loop of Nt, the number of parallel transitions. At Block H the method uses the Record History, the current state and transition value to sum the reference r, using the output from the Channel LUT 14 (summation element 34 in FIG. 3A). At Block I the difference d is computed as y−r (difference element 32 in FIG. 3A), and the branch metric b is then computed in the absolute magnitude squared element 26 of FIG. 3A. In Block 3 the cumulative metric is computed by adding in summation element 30 of FIG. 3A the originating state cumulative metric from the Record 18 and the branch metric b. At Block K the Local Compares block 22 of FIG. 3A decodes (decoder 22B) the History and soft bit existences from the Local Memory 13, and at Block L the cumulative metric comparisons are performed (using comparators 23A-23E of FIG. 4B). At Block M the method overwrites, as necessary, the cumulative metric and soft bit values, and at Block N the soft bit values are computed, substituting is necessary. At Block O the loop is reentered at the appropriate point, depending on the state of the outer and two inner loop counters.

As the preferred embodiment of the invention is implemented in an ASIC or some other type of integrated circuit, a consideration is now made of the gate count and timing. The gate count follows from the hardware architecture. The timing analysis may use both the hardware and the pseudocode to evaluate the critical path for determination of the minimum clock rate required.

The gate counts for the basic components needed are provided for reference purposes only, and are exemplary of one suitable embodiment.

| n_input bit | Adder-real | Multiplier-real | Adder-Complex | Mult-Complex |
|---|---|---|---|---|
| 10 | 260 | 870 | 520 | 4000 |
| 11 | 286 | 1045 | 572 | 4752 |
| 12 | 312 | 1236 | 624 | 5568 |
| 13 | 338 | 1443 | 676 | 6448 |
| 14 | 364 | 1666 | 728 | 7392 |
| 15 | 390 | 1905 | 780 | 8400 |
| 16 | 416 | 2160 | 832 | 9472 |
| 17 | 442 | 2431 | 884 | 10608 |
| 18 | 468 | 2718 | 936 | 11808 |
| 19 | 494 | 3021 | 988 | 13072 |
| 20 | 520 | 3340 | 1040 | 14400 |

Each device is assumed to have a latched input and output. A real adder requires 26n gates and a real multiplier requires $8n^2+7n$ gates, where n is the input word length.

Using the gate counts one may estimate the number of gates for a single PE 12, excluding control logic.
r—1 complex adder.
d=y−r; 1 complex adder
b=|d|$^2$; 2 real multipliers and 1 real adder;
c=c+b; 1 real adder
local compares; 1 real adder
global compares; 1 real adder;
memory
1 record and 1 LM per PE require a total of 25 16 bit words
1 LUT per PE requires 96 16 bit words

| PE 12 Gate Count | | |
|---|---|---|
| function (all are 16 bits) | Number per PE | gates |
| complex adder | 2 | 1664 |
| real multiplier | 2 | 4320 |
| real adder | 4 | 1664 |
| LM (16 bit words - latch) | 9 | 576 |
| R (16 bit words - latch) | 16 | 1024 |
| LUT (16 bit words - SRAM) | 96 | 2304 |
| Total per PE with dedicated LUT | | 11,452 approx. 12,000 |

Latch memory is counted at 16 transistors per bit, 64 gates per 16 bit word. SRAM memory is counted at 6 transistors per bit, 24 equivalent gates per 16 bit word. The gate counts shown include redundant registers, as the gate counts for each adder and multiplier include individual latches at the input and output.

Per equalizer, 1 complex multiplier, assume 10 bit inputs, is needed for construction of the LUT 14. This adds 4000 gates to the overall total. Assume C_LUT is calculated once per burst and then copied in to each of N local lookup tables, one per PE 12. In this way, it is not necessary to arbitrate access to the data therein. The number of C_LUT registers could be reduced to 96 in all cases by introducing arbitration between the PEs 12 and the Channel_LUT table 14.

Gate Count Totals

| | 2 state, number | 2 state, gates | 4 state, number | 4 state, gates | 16 state, number | 16 state, gates |
|---|---|---|---|---|---|---|
| 10 bit complex mult | 1 | 4,000 | 1 | 4,000 | 1 | 4,000 |
| number of PEs | 2 | 24,000 | 4 | 48,000 | 16 | 192,000 |
| number of LUTs | 2 | | 4 | | 16 | |
| Total gates | | 28,000 | | 52,000 | | 196,000 |

Figure 3B:
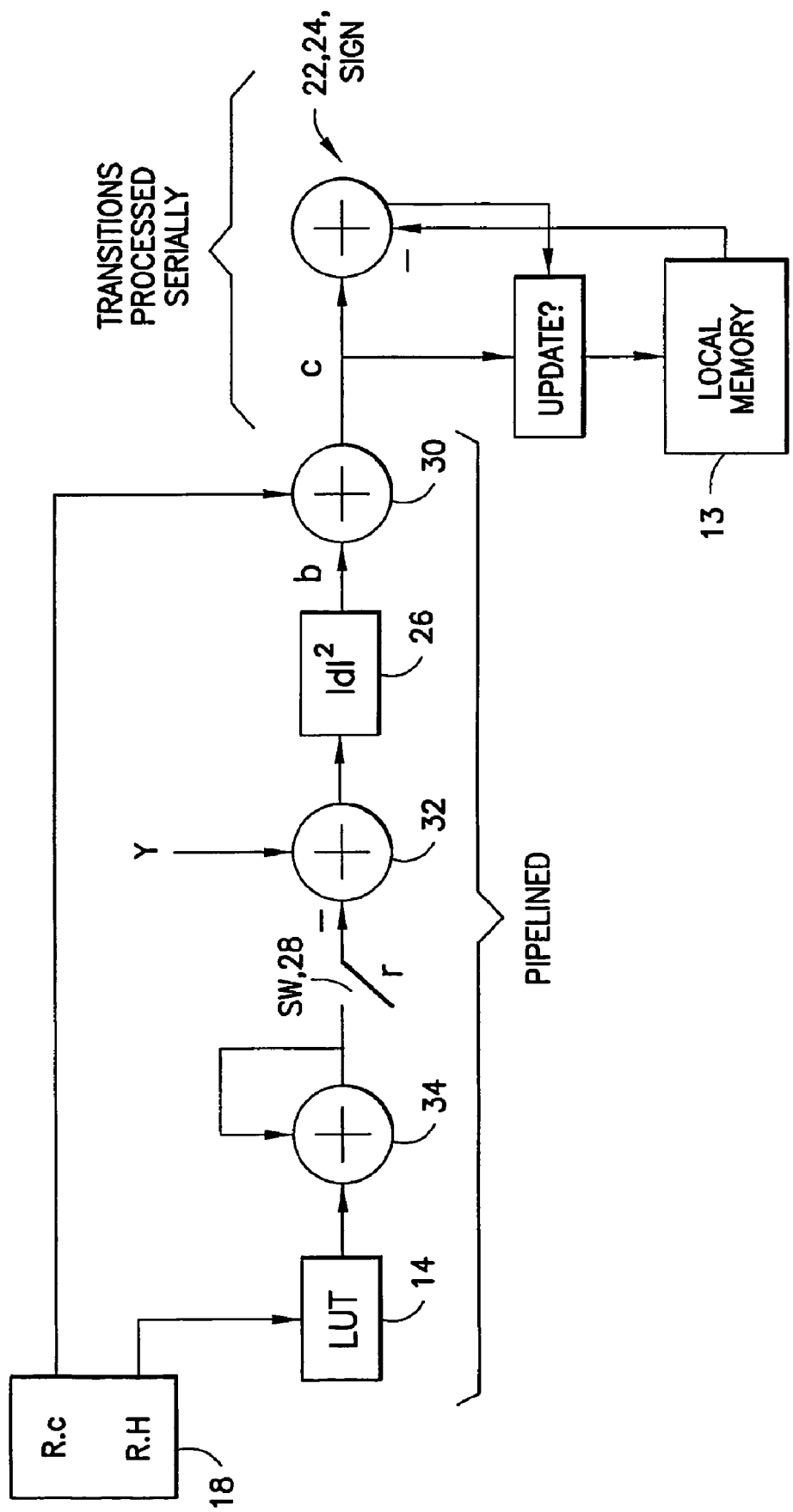
FIG. 3B shows the critical processing path of the PE of FIG. 3A.

A purpose of the timing analysis is to discover the critical path of the algorithm shown in the pseudo code when implemented on the systolic equalizer 10. Reference can also be made to FIG. 3B, which illustrates the PE 12 of FIG. 3A so as to emphasize the pipelined portion of the architecture and the portion where the transitions are processed serially.

Once per burst:
1. Initialize the 48 complex elements of Channel_LUT 14.
2. Initialize the LM 13 and R 18 of each PE 12

```
for each receive sample {
    Normalize LM.cum, compute soft substitution.
    transfer LM into R. - 9 words, e.g., nine clocks (ticks)
    Repeat N times { // cycling of records
        Repeat Nt times { // parallel transitions; assume pipelining of
        this Nt loop
            Repeat Nh times { // sum up the reference
                            pipelined { Read from C_LUT, Clock
                            Adder1 }
            } // Nh; give this Nh+1 = 7 ticks
                            subtract from sample using Adder2;
                            1 tick
                            take magnitude square; 2 ticks
                            add R.cum; 1 tick
                            cum has been produced for this
                            transition
                            5 similar compares: {
                                smallest_cum,cum,cum0/1(3)
                            }
                            potentially overwrite history; 2 ticks
        } // Nt
    } // N
``` compute soft outputs; clock ticks neglected

Timing critical path

| | 2 state | 4 state | 16 state |
|---|---|---|---|
| formation of r (pipelined) | 7 ticks | 7 ticks | 7 ticks |
| d = r-y; (pipelined) | 1 | 1 | 1 |
| b = \|d\|²; (pipelined) | 2 | 2 | 2 |
| 3 local compares cum0/1 | 6 | 6 | 6 |
| min cum compare | 2 | 2 | 2 |
| max cum compare | 2 | 2 | 2 |
| possible history overwrite | 2 | 2 | 2 |
| ticks per transition | 10 + 12 Nt | 10 + 12 Nt | 10 + 12 Nt |
| transitions per record, Nt | 4 | 2 | 2 |
| records per PE | 2 | 4 | 4 |
| extra ticks to position records for next sample | 0 | 0 | 16 (at least) |
| extra ticks to load LM into R before next sample | 9 | 9 | 9 |
| ticks per sample | 117 | 145 | 161 |
| samples per burst | 116 | 116 | 116 |
| burst period (microseconds) | 577 | 577 | 577 |
| minimum required clock rate (MHz) | approx. 24 MHz | approx 30 MHz | approx 33 MHz. |

It would be possible to schedule unrelated comparisons to overlap. For instance, if the first transition has a cum0 value for bit 0, and the second transition has a cum1 value for bit 0, then these can be updated and compared to Local Memory 13 in parallel. An overwrite of Local Memory 13 by the first transition's value of cum0, bit0, will not collide with a comparison of that register by the second transition, since it has no value there. Allowing for these kinds of scheduling can reduce the critical path Based on the foregoing description those skilled in the art should appreciate that the disclosed systolic equalizer 10 provides a number of advantages over conventional equalizers. It is again noted that while Lloyd discuss a locally connected array (FIG. 3), and state that their application is applicable to both Viterbi decoding and Viterbi equalization, they do not disclose the scalable channel equalizer 10 that is constructed and operated as a parallel, systolic array of like processing elements 12 that exhibits, among other features, reduced state sequence estimation, decision feedback and the global search function (Global Compares block 24) for metric normalization and soft value determination. In the presently preferred embodiment of the equalizer 10 the sorting of soft values can be accomplished by multiple passes through the systolic array.

In addition, a 16 state equalizer can be realized as four, four PE 12 linear arrays, and by shifting the Records 18 as described above. This invention also provides for cycling the LM 13 against the Records 18, interleaved with shifts of the Records 18 every four clocks to provide a four state equalizer using but one PE 12. Thus, it should be appreciated that this invention provides an equalizer 10 that contains a logical arrangement of a plurality of instantiations of the locally coupled, possibly identical processing elements 12 that form the systolic array. The arrangement may be viewed as being logical in the sense that, as examples, a 16 state equalizer can be realized with but four physical PEs 12, and a four state equalizer can be realized with but one PE 12.

The scalability made possible by the teachings of this invention also enables using one four PE systolic array to realize a two state equalizer, such as by powering off or otherwise disabling two of the PEs; a four state equalizer (as shown in FIGS. 2B and 2C); or a 16 state equalizer by cycling the LMs 13 and the Records 18, as shown in FIG. 7.

This invention also provides for using combinatorial logic, as shown in FIG. 4B, for decoding path histories and activating cumulative metric comparators for sorting cumulative metrics so as to ultimately obtain the desired soft bits.

Although described in the context of particular embodiments of the scalable systolic architecture, it should be apparent to those skilled in the art that a number of modifications and various changes to these teachings may occur. Thus, while the invention has been particularly shown and described with respect to one or more preferred embodiments thereof, it will be understood by those skilled in the art that certain modifications or changes, in form and shape, may be made therein without departing from the scope of the invention as set forth above.

What is claimed is:

1. An equalizer, comprising a logical arrangement of a plurality of instantiations of locally coupled processing elements PEs forming a systolic array for processing in common received signal samples having distortion induced by passage through a communications channel, and outputting soft values for input to a decoder, the soft values representing an approximation of maximum a posteriori (MAP) probabilities, the equalizer further comprising a global compares block for comparing a data entry in records operated on by said plurality of instantiations of locally coupled PEs and selectively overwriting said data entry in one of said records based on the comparing.

2. An equalizer as in claim 1, where a trellis search procedure is employed to reconstruct estimates of a received signal sequence based on a reduced number of states represented by a plurality of groups determined by partitioning a symbol constellation such that there are fewer groups than possible symbols.

3. An equalizer as in claim 2, where the symbol constellation represents one formed by 8-PSK modulation of a transmitted signal sequence.

4. An equalizer as in claim 1, where an effect of a prior symbol is subtracted using a decision feedback mechanism.

5. An equalizer as in claim 1, where said locally coupled processing elements operate in parallel and each comprise an input node for receiving a Record to be processed; a node for coupling to a channel look-up table (Channel LUT) addressed by the Record and storing products of individual channel taps with individual constellation points of a symbol constellation; a local memory (LM); and circuitry for calculating a reference, r, using data stored in the Channel LUT; circuitry for computing a difference $d=y-r$, where y is one of the received signal samples; circuitry for squaring the difference value, $b=|d|^2$ to form a branch metric; circuitry for adding the branch metric to a cumulative metric of the Record and circuitry for examining a path history in the Record and updating the LM path history and the LM metrics as needed, and where at least one processing element further comprises circuitry, operating after all Records are processed, for performing a global metric comparison and updating Records and LMs as needed.

6. An equalizer as in claim 1, where said locally coupled processing elements are coupled together as a linear systolic array of processing elements.

7. An equalizer as in claim 1, where said logical arrangement of the plurality of instantiations of locally coupled processing elements is embodied in one processing element, where for N states the one processing element successively processes N instantiations of a local memory against an input Record, each of which stores data that comprises cumulative metrics.

8. An equalizer as in claim 1, where for N states there are M instantiations of said locally coupled identical processing elements, where M<N, and where delays are inserted between serially coupled processing elements.

9. An equalizer as in claim 1, comprising combinatorial logic for decoding path histories and activating cumulative metric comparators for sorting cumulative metrics so as to obtain the soft values.

10. An equalizer as in claim 1, wherein said equalizer is embodied within an integrated circuit.

11. The equalizer of claim 1 wherein said global compares block is disposed within one of said PEs.

12. The equalizer of claim 1 wherein said global compares block operates to selectively overwrite said data entry when said comparing results in a more extreme metric than said data entry.

13. A method for processing, on a burst by burst basis, received signal samples having distortion induced by passage through a communications channel, comprising:
providing a reduced state equalizer comprised of a logical arrangement of a plurality of instantiations of locally coupled processing elements (PEs) forming a systolic array, each PE having an input and an output and an associated Local Memory (LM) and Channel Look-Up Table (LUT);
obtaining an estimate of the channel;
initializing Records (R) and PEs and calculating the contents of the Channel LUT;
for each received signal sample y, normalizing a cumulative metric in each PE LM and repeating N times,
accepting a Record at each PE input;
processing the Record and updating each PE LM; and
shifting the Record from the PE input to the PE output; and
outputting soft values for input to a decoder, the soft values representing an approximation of maximum a posteriori (MAP) probabilities.

14. A method as in claim 13, where each Record comprises a cumulative metric, a trellis path history, old cumulative metrics, a smallest cumulative metric, and existing cumulative metrics, and where each LM comprises the cumulative metric, the path history, new and old smallest cumulative metrics, new and old cumulative metrics, and existing cumulative metrics.

15. A method as in claim 13, where processing the Record comprises computing a branch metric, combining the branch metric with an originating state cumulative metric from the Record to form a new cumulative metric, and performing cumulative metric compares for potentially modifying values stored at least in the LM.

16. A method as in claim 13, where said logical arrangement of the plurality of instantiations of locally coupled processing elements is embodied in one processing element, where said one processing element successively processes N instantiations of the LM against an input Record, where N is number of states.

17. A method as in claim 13, where there are M instantiations of said locally coupled processing elements, where M<N, where N is number of states, and where delays are inserted between serially coupled processing elements.

18. A method as in claim 13, where processing the Record comprises decoding a path history and cumulative metric existences and activating cumulative metric comparators for sorting cumulative metrics so as to obtain the soft output values.

19. A method as in claim 13, where processing the Record comprises each PE operating in parallel to:
  calculate a reference, r, using data stored in the Channel LUT;
  compute a difference d=y−r;
  square the difference value, b=|d|² form a branch metric;
  add the branch metric to a cumulative metric of the Record; and
  examine a path history in the Record and updates the Local Memory path history and the Local Memory metrics as needed.

20. A method as in claim 19, further comprising, after all Records are processed, performing a global metric comparison and updating Records and Local Memories as needed.

21. A method as in claim 13, where said equalizer performs Viterbi equalization of an 8-PSK, EDGE (Enhanced Data rate for Global Evolution) signal received though an RF communications channel.

22. A method as in claim 13, where a trellis upon which the processing elements operate comprises one of a fully connected trellis or a partially connected trellis.

23. An equalizer, comprising a logical arrangement of a plurality of instantiations of locally coupled processing elements PEs forming a systolic array for processing in common received signal samples having distortion induced by passage through a communications channel, and outputting soft values for input to a decoder, the soft values representing an approximation of maximum a posteriori (MAP) probabilities, wherein each PE is coupled to a channel lookup table LUT of possible products of channel taps and constellation points.

24. The equalizer of claim 23 wherein a separate LUT is associated with each PE.

25. The equalizer of claim 23 wherein the LUT is loaded at a start of each time slot over which the PEs operate on a set of inputs.

26. The equalizer of claim 25 wherein the channel taps used to load the LUT are fixed at the start of each time slot and said LUT is not adaptive during a time slot once loaded.

* * * * *